United States Patent
Chae

(10) Patent No.: US 9,608,168 B2
(45) Date of Patent: Mar. 28, 2017

(54) LIGHT EMITTING DIODE

(71) Applicant: Seoul Viosys Co., Ltd., Ansan-si (KR)

(72) Inventor: Jong Hyeon Chae, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 14/734,835

(22) Filed: Jun. 9, 2015

(65) Prior Publication Data
US 2015/0364653 A1    Dec. 17, 2015

(30) Foreign Application Priority Data

Jun. 13, 2014  (KR) .................. 10-2014-0072356
Jun. 30, 2014  (KR) .................. 10-2014-0081058

(51) Int. Cl.
*H01L 33/38* (2010.01)
*H01L 33/40* (2010.01)
*H01L 33/42* (2010.01)
*H01L 33/20* (2010.01)

(52) U.S. Cl.
CPC ............ *H01L 33/405* (2013.01); *H01L 33/38* (2013.01); *H01L 33/20* (2013.01); *H01L 33/382* (2013.01); *H01L 33/42* (2013.01)

(58) Field of Classification Search
CPC ..... H01L 33/405; H01L 33/382; H01L 33/42; H01L 33/46; H01L 33/54; H01L 33/56; H01L 33/38; H01L 33/40
See application file for complete search history.

(56) References Cited

U.S. PATENT DOCUMENTS

| | | | |
|---|---|---|---|
| 2011/0210362 A1* | 9/2011 | Lee | H01L 33/382 257/98 |
| 2014/0361327 A1* | 12/2014 | Chae | H01L 33/22 257/98 |
| 2015/0200230 A1* | 7/2015 | Jang | H01L 27/156 257/91 |
| 2015/0255504 A1* | 9/2015 | Jang | H01L 27/153 257/88 |

OTHER PUBLICATIONS

Taiwanese Office Action, Application No. 10521174890, Sep. 29, 2016, 6 pages.
LED, website of National Cheng Kung University, http://www.iaa.ncku.edu.tw/~cywen/labsisciedu/NewEnergy/LED2.html, Aug. 31, 2016.

* cited by examiner

*Primary Examiner* — Fazli Erdem
(74) *Attorney, Agent, or Firm* — Perkins Coie LLP

(57) ABSTRACT

Exemplary embodiments provide a light emitting diode that includes: at least one lower electrode providing a passage for electric current; a light emitting structure placed over the at least one lower electrode to be electrically connected to the lower electrode, the light emitting structure is disposed to form at least one via-hole; a reflective electrode layer placed between the at least one lower electrode and the light emitting structure; and an electrode pattern formed around the light emitting structure and electrically connecting the lower electrode to the light emitting structure through the via-hole.

20 Claims, 28 Drawing Sheets

LIGHT EMITTING DIODE

CROSS-REFERENCE TO RELATED APPLICATION

This application claims priority from and the benefit of Korean Patent Application No. 10-2014-0072356, filed on Jun. 13, 2014 and Korean Patent Application No. 10-2014-0081058, filed on Jun. 30, 2014, the contents of which are incorporated by reference for all purposes as if fully set forth herein.

TECHNICAL FIELD

Exemplary embodiments of the disclosed technology relate to a light emitting diode and a method of fabricating the same. For example, exemplary embodiments of the disclosed technology relate to a light emitting diode which is fabricated by separating a growth substrate at the wafer level, and a method of fabricating the same.

BACKGROUND

Light emitting diodes refer to inorganic semiconductor devices that emit light generated by recombination of electrons and holes, and are used in a variety of fields such as displays, vehicle lamps, general lighting devices, and the like.

Light emitting diodes can be classified into lateral type light emitting diodes, vertical type light emitting diodes, and flip-chip type light emitting diodes according to locations of electrodes or a connection type between the electrodes and an external lead.

The lateral type light emitting diodes can be fabricated relatively easily and thus are the most widely used in the art. Such a lateral type light emitting diode includes a growth substrate at a lower side thereof instead of being separated therefrom. As the growth substrate of the light emitting diode, a sapphire substrate is most widely used in the art and has a problem of difficulty in discharge of heat from the light emitting diode due to low thermal conductivity of the sapphire substrate. As a result, the light emitting diode has an increased junction temperature and decreased internal quantum efficiency, and becomes unsuitable for high current driving.

The vertical type and flip-chip type light emitting diodes have been developed in order to solve the problems of the lateral type light emitting diodes. Generally, as compared with a typical lateral type light emitting diode, the vertical type light emitting diode has good current spreading performance by adopting a structure in which a p-electrode is located at a lower side, and also exhibits good heat dissipation efficiency by adopting a support substrate which has higher thermal conductivity than sapphire. Furthermore, in the vertical type light emitting diode, an N-plane is subjected to anisotropic etching by photo enhanced chemical (PEC) etching or the like to form a rough surface, thereby significantly improving upward light extraction efficiency. However, in the vertical type light emitting diode, a total thickness of epitaxial layers is thin as compared with a luminous area, thereby providing difficulty in current spreading. That is, since the vertical type light emitting diode fabricated using an electrically conductive nitride layer is configured to allow direct flow of electric current between an upper electrode and a lower electrode formed at a lower side of the nitride layer, it is difficult to achieve uniform current spreading over the entirety of the active region. To solve this problem, an insulation material is provided to a location of a p-electrode corresponding to an n-electrode pad to prevent electric current from directly flowing from the n-electrode pad to the p-electrode. However, with this structure, the light emitting diode has a problem of cracking between the p-electrode and the insulation material during a process of removing the substrate.

On the other hand, the vertical type light emitting diode includes a lower semiconductor layer and an upper semiconductor layer formed of different conductive type semiconductors, and requires electrodes respectively connected to the upper and lower semiconductor layers. Thus, in fabrication of the vertical type light emitting diode, there is a need for a process of separating a growth substrate from the semiconductor layers.

Generally, in order to prevent damage to the semiconductor layers upon separation of the growth substrate, a metal substrate is bonded to the semiconductor layer at an opposite side to the growth substrate before separation of the growth substrate from the semiconductor layer. Then, the growth substrate is separated from the semiconductor layer by laser lift-off, chemical lift-off, or stress lift-off. The metal substrate is bonded to the semiconductor layer via a separate bonding layer, which serves to bond the metal substrate to the semiconductor layer while being cooled from a certain bonding temperature or more to room temperature.

On the other hand, the metal substrate and the semiconductor layer, for example, a gallium nitride-based semiconductor layer, have different coefficients of thermal expansion, thereby causing a bowing phenomenon wherein the semiconductor layer is bent while being cooled from the bonding temperature to room temperature. Such a bowing phenomenon becomes severe upon separation of the growth substrate over a large area. When the growth substrate is separated over a large area, there is a high possibility of damage to the semiconductor layer due to the bowing phenomenon, thereby making it difficult to separate the growth substrate at the wafer level. In order to prevent damage to the semiconductor layer caused by the bowing phenomenon, the growth substrate is separated from individual light emitting diodes after the wafer is divided into unit diodes. As a result, a conventional method of fabricating a vertical type light emitting diode requires a complicated process and high manufacturing costs.

Furthermore, since the typical vertical type light emitting diode has an upper metal electrode placed on a light emitting plane, the upper metal electrode can shield light emitted from the active layer. As a result, the vertical type light emitting diode can suffer from deterioration in light extraction efficiency.

SUMMARY

Exemplary embodiments provide a light emitting diode that has improved light extraction efficiency and allows high current driving.

Exemplary embodiments provide a light emitting diode that can be directly mounted on a printed circuit board or the like via solder paste by preventing diffusion of metal elements of the solder paste.

Exemplary embodiments provide a light emitting diode that has improved current spreading performance and allows high current driving.

Exemplary embodiments provide a light emitting diode having improved structural stability and exhibiting excellent heat dissipation efficiency.

Exemplary embodiments provide a light emitting diode fabricated at the wafer level.

Exemplary embodiments provide a light emitting diode that includes a support member replacing a secondary substrate at the wafer level and having pads formed thereon.

Exemplary embodiments provide a light emitting diode that can minimize or prevent occurrence of a bowing phenomenon after separation of a growth substrate from a semiconductor layer, thereby enabling separation of the growth substrate over a large area.

Exemplary embodiments provide a method of fabricating the light emitting diode as set forth above.

In one aspect, a light emitting diode is provided to comprise: at least one lower electrode providing a passage for electric current; a light emitting structure placed over the at least one lower electrode to be electrically connected to the lower electrode, the light emitting structure is disposed to form at least one via-hole; a reflective electrode layer placed between the at least one lower electrode and the light emitting structure; and an electrode pattern formed around the light emitting structure and electrically connecting the lower electrode to the light emitting structure through the via-hole.

In some implementations, the electrode pattern comprises a transparent electrode layer comprising ITO, ZnO, SnO2, graphene, or carbon nanotubes. In some implementations, the light emitting diode comprises a mold surrounding a side of the lower electrode, wherein a lower surface of the lower electrode is flush with a lower surface of the mold. In some implementations, the mold comprises a plurality of fastening elements, the mold being mechanically fastened to the lower electrode through the plurality of fastening elements. In some implementations, each of the fastening elements comprises a plurality of depressions and a plurality of protrusions, the plurality of protrusions having an increasing width in a protruding direction. In some implementations, the plurality of protrusions have a continuously or intermittently varying width. In some implementations, the mold comprises a photosensitive polyimide, Su-8, photoresist for plating, Parylene, an epoxy molding compound (EMC), or ceramic powder. In some implementations, the lower electrode has a height of 20 μm to 200 μm. In some implementations, the reflective electrode layer comprises a reflective metal layer and a capping metal layer covering the reflective metal layer. In some implementations, the light emitting diode comprises: a pad metal layer placed between the lower electrode and the reflective electrode layer to be electrically connected to the lower electrode, the pad metal layer being electrically connected to the electrode pattern through the via-hole. In some implementations, the light emitting diode further comprises: a first insulation layer placed between the reflective electrode layer and the pad metal layer, the first insulation layer is disposed to expose a first region corresponding to the via-hole and a second region in which the reflective electrode layer is electrically connected to the pad metal layer. In some implementations, the first insulation layer comprises a distributed Bragg reflector. In some implementations, the light emitting diode comprises at least two lower electrodes separated from each other, and one of the at least two lower electrodes is electrically connected to the electrode reflective layer through the second region and the other of the at least two lower electrode is electrically connected to the electrode pattern through the first region. In some implementations, the electrode pattern is formed to include a portion to be electrically connected to the light emitting structure. In some implementations, the light emitting diode further comprises: a second insulation layer insulating a side surface of the light emitting structure and a portion of an upper surface of the light emitting structure from the electrode pattern. In some implementations, a surface of the light emitting structure includes roughness. In some implementations, the lower electrode comprises a conduction layer, a barrier layer, or an anti-oxidation layer. In some implementations, the electrode pattern comprises a plurality of extensions extending in one direction of the light emitting diode. In some implementations, at least some of the plurality of extensions overlaps the isolation region. In some implementations, the electrode pattern comprises a first extension and a second extension, the first extension extending away from the via-hole, the second extension extending perpendicularly to the first extension.

DETAILED DESCRIPTION

Figure 1A:
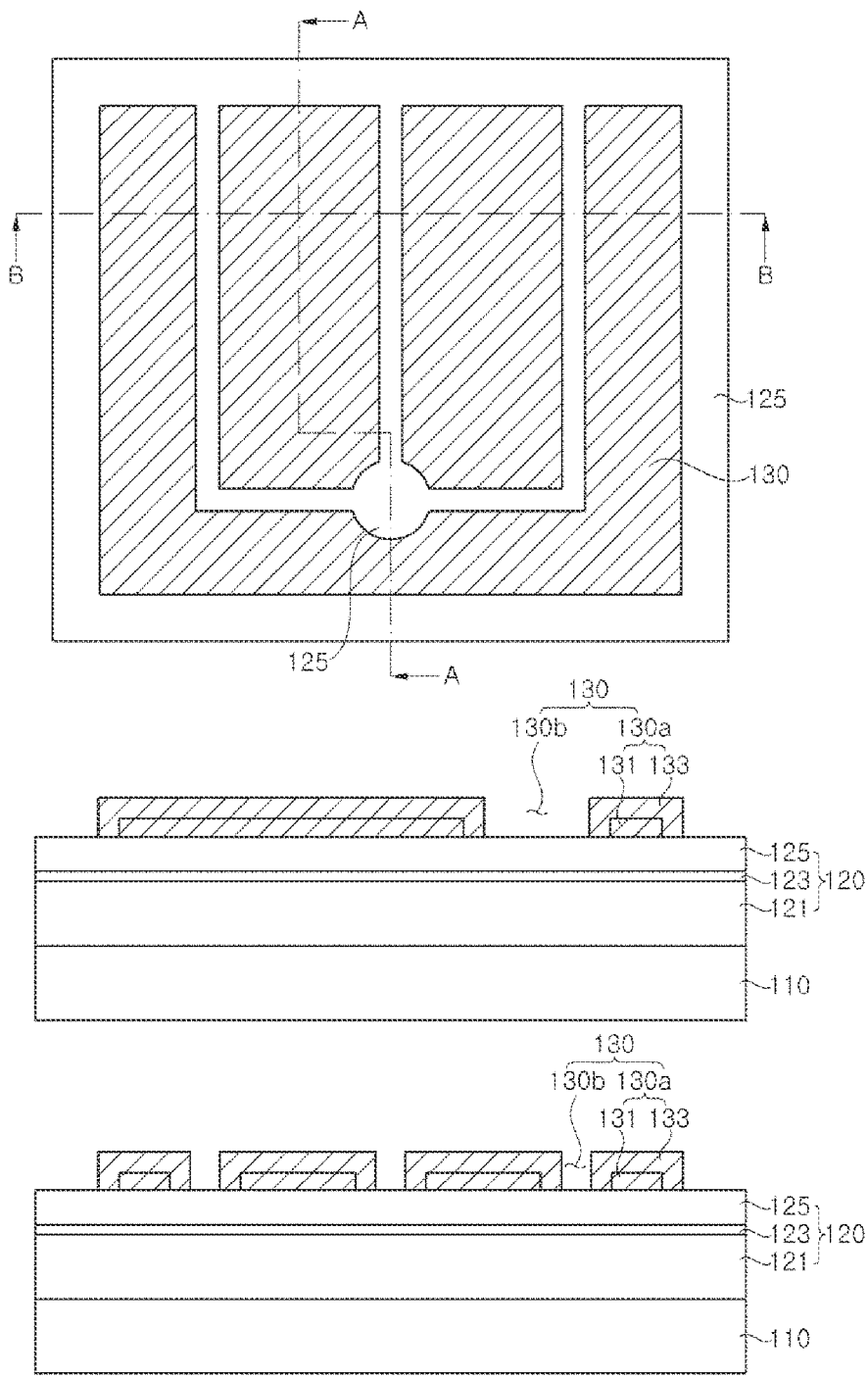
FIG. 1a to FIG. 6d are plan views and sectional views illustrating a light emitting diode and a method of fabricating the same according to exemplary embodiments of the disclosed technology.

Recently, studies have been made to develop a technology for fabricating a light emitting diode module by directly bonding pads of a light emitting diode to a printed circuit board via solder paste. For example, the light emitting diode module is fabricated by directly mounting a light emitting diode chip on a printed circuit board (PCB) instead of packaging the light emitting diode chip. Since the pads directly adjoin the solder paste in the light emitting diode module, metal elements such as tin (Sn) in the solder paste diffuse into the light emitting diode through the pads and can generate short circuit in the light emitting diode, thereby causing device failure. Therefore, there is a need for development of a light emitting diode that overcomes such problems in the related art, and a method of fabricating the same.

Hereinafter, exemplary embodiments of the disclosed technology will be described in detail with reference to the accompanying drawings. The following embodiments are provided by way of example so as to facilitate understanding of some exemplary implementations of the disclosed technology. Accordingly, the disclosed technology is not limited to the embodiments disclosed herein and may also be implemented in different forms. In the drawings, widths, lengths, thicknesses, and the like of elements may be exaggerated for clarity and descriptive purposes. When an element or layer is referred to as being "placed on" or "disposed on" another element or layer, it may be directly "placed on" or "disposed on" the other element or layer or intervening elements or layers may be present. Throughout the specification, like reference numerals denote like elements having the same or similar functions.

FIG. 1a to FIG. 6d are plan views and sectional views illustrating a light emitting diode and a method of fabricating the same according to exemplary embodiments of the disclosed technology.

In FIG. 1a, top figure is a plan view of a growth substrate of a light emitting diode according to one exemplary embodiment, in which a reflective electrode layer is placed on an epitaxial layer, middle figure is a sectional view taken along line A-A in top figure of FIG. 1a, and bottom figure is a sectional view taken along line B-B in (b) of FIG. 1a.

Referring to FIG. 1a, a growth substrate 110 is prepared and epitaxial layers 120 are formed on the growth substrate 110. The growth substrate 110 may be any substrate allowing growth of the epitaxial layers 120 thereon, and may include, for example, a sapphire substrate, a silicon substrate, a silicon carbide substrate, a spinel substrate, or a nitride substrate. For example, in this embodiment, the growth substrate 110 may be or include a sapphire substrate.

When the growth substrate 110 is formed of or includes a different material than that of the epitaxial layers 120 to be grown on the growth substrate 110, for example, when the epitaxial layers 120 include nitride semiconductors and the growth substrate 110 is a heterogeneous substrate such as a sapphire substrate, the light emitting diode according to this embodiment may further include a buffer layer (not shown) on the growth substrate 110.

Further, the growth substrate 110 may include a variety of growth planes, for example, a polar growth plane such as a c-plane (0001), a non-polar growth plane such as an m-plane (1-100) or an a-plane (11-20), or a semi-polar growth plane such as a (20-21) plane. Alternatively, the growth substrate 110 may be a patterned substrate.

A first conductive type semiconductor layer 121, an active layer 123 and a second conductive type semiconductor layer 125 are grown on the growth substrate 110.

The first conductive type semiconductor layer 121 may include, for example, an n-type gallium nitride (GaN)-based semiconductor layer and the second conductive type semiconductor layer 125 may include a p-type GaN-based semiconductor layer. Further, the active layer 123 may have a single quantum well structure or a multi-quantum well structure, and may include a well layer and a barrier layer. Further, the composition of the well layer may be determined depending upon a desired wavelength of light, and may include, for example, InGaN.

The first conductive type semiconductor layer 121 and the second conductive type semiconductor layer 125 may be different conductive type semiconductor layers, and the semiconductor layers 121, 123, 125 may be formed by various deposition and growth methods including metal organic chemical vapor deposition (MOCVD), molecular beam epitaxy (MBE), or hydride vapor phase epitaxy (HVPE), and the like.

Herein, the explanations of well-known techniques relating to the semiconductor layers will be omitted.

A reflective pattern layer 130 may be disposed on the second conductive type semiconductor layer 125. The reflective pattern layer 130 may include a plurality of reflective electrode layers 130a and isolation regions 130b each placed between the plurality of reflective electrode layers 130a to isolate the reflective electrode layers 130a from each other. The reflective pattern layer 130 may be placed on the second conductive type semiconductor layer 125 by taking into account placement of an electrode pattern (not shown) which will be formed in a subsequent process. Accordingly, the second conductive type semiconductor layer 125 can be exposed in some regions of the isolation regions 130b of the reflective pattern layer 130.

In this exemplary embodiment, the isolation regions 130b may include a plurality of extensions separated from each other and extending from one side to the other side, and the reflective electrode layers 130a may be divided from each other by the plurality of extensions.

Further, in this exemplary embodiment, an insulation layer is disposed in the isolation regions 130b and the electrode pattern (not shown) may be formed in an upper region of the insulation layer, in which some regions of the isolation regions 130b may overlap the electrode pattern.

The reflective electrode layers 130a may include a reflective metal layer 131 and a capping metal layer 133. The capping metal layer 133 may cover an upper surface and a side surface of the reflective metal layer 131.

The reflective metal layer 131 may serve to reflect light and may also act as an electrode electrically connected to an epitaxial layer 120. Thus, it is desirable that the reflective metal layer 131 includes a material having high reflectivity and capable of forming ohmic contact. The reflective metal layer 131 may include at least one of, for example, Ni, Pt, Pd, Rh, W, Ti, Al, Ag, or Au, and may be composed of multiple layers, for example, Ni/Ag/Ni/Au layers.

The capping metal layer 133 prevents inter-diffusion between the reflective metal layer 131 and other materials. Accordingly, it is possible to prevent increase in contact resistance and reduction in reflectivity due to damage of the reflective metal layer 131. The capping metal layer 133 may include at least one of Ni, Cr, Ti, Pt, Pd, Rh or W, and may be composed of multiple layers.

The reflective pattern layer 130 may be formed by any suitable techniques such as deposition and lift-off, or e-beam evaporation. For example, a photoresist may be formed in a region in which the reflective electrode layers 130a are formed and not be formed in the isolation region 130b, and a metal layer is formed through a typical heat deposition process. Then, the photoresist is removed to complete the formation of the reflective pattern layer 130 on the second conductive type semiconductor layer 125.

FIG. 1a shows a part of a wafer before wafer division. The part of the wafer may correspond to a unit diode area in which a light emitting diode according to exemplary embodiments will be formed. In this case, a region at or around distal ends of the growth substrate 110 and the epitaxial layers 120 in which the reflective pattern layer 130 is not formed may be an isolation region. It should be noted that the drawings illustrating the following exemplary embodiments show the unit diode region unless otherwise specified.

Figure 1B:
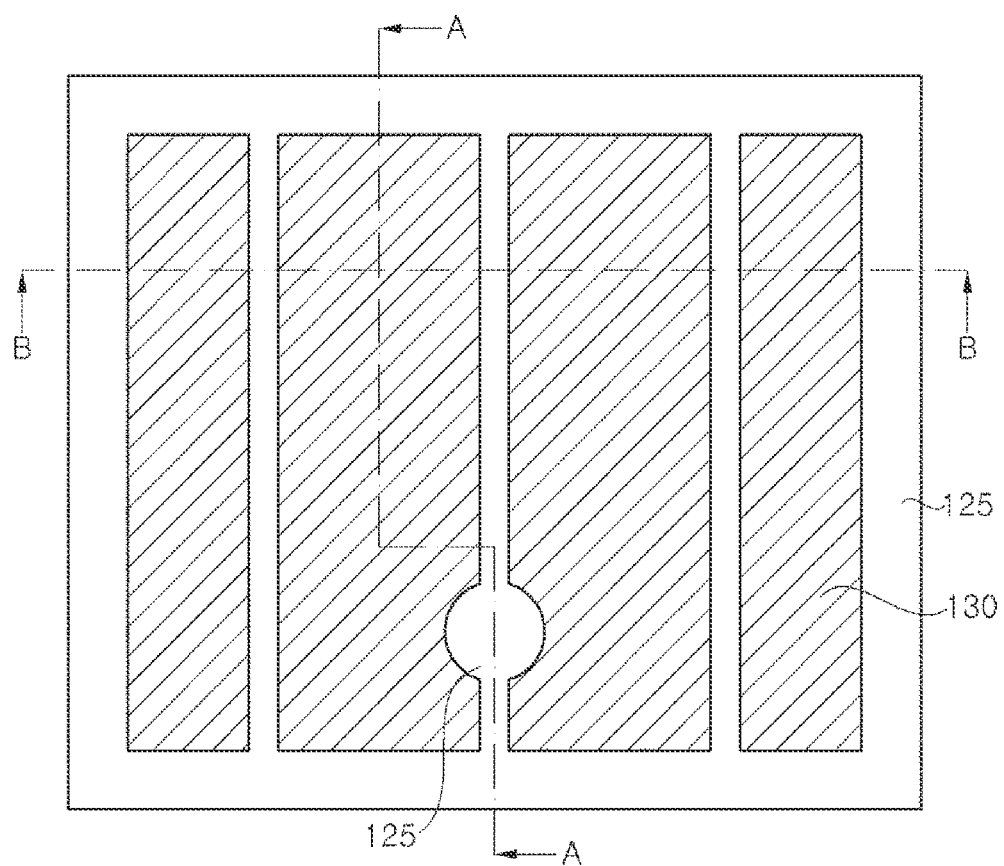

FIG. 1b is a plan view of a growth substrate of a light emitting diode according to another exemplary embodiment in which a reflective electrode layer is formed on an epitaxial layer.

The light emitting diode according to the exemplary embodiment shown in FIG. 1b is substantially the same as the light emitting diode of the exemplary embodiment of FIG. 1a and differs in the shape of the reflective pattern layer 130. Here, the repeated descriptions of the same components will be omitted.

Referring to FIG. 1a, the reflective pattern layer 130 may include reflective electrode layers 130a and isolation regions 130b that are alternately arranged. For example, the reflective electrode layers 130a and the isolation regions 130b may be arranged in a stripe pattern. Herein, although the arrangement pattern of the reflective electrode layers 130a and the isolation regions 130b of the reflective pattern layer 130 is shown by way of example in FIG. 1a, top figure and FIG. 1b, it should be understood that other implementations are also possible.

Figure 2:
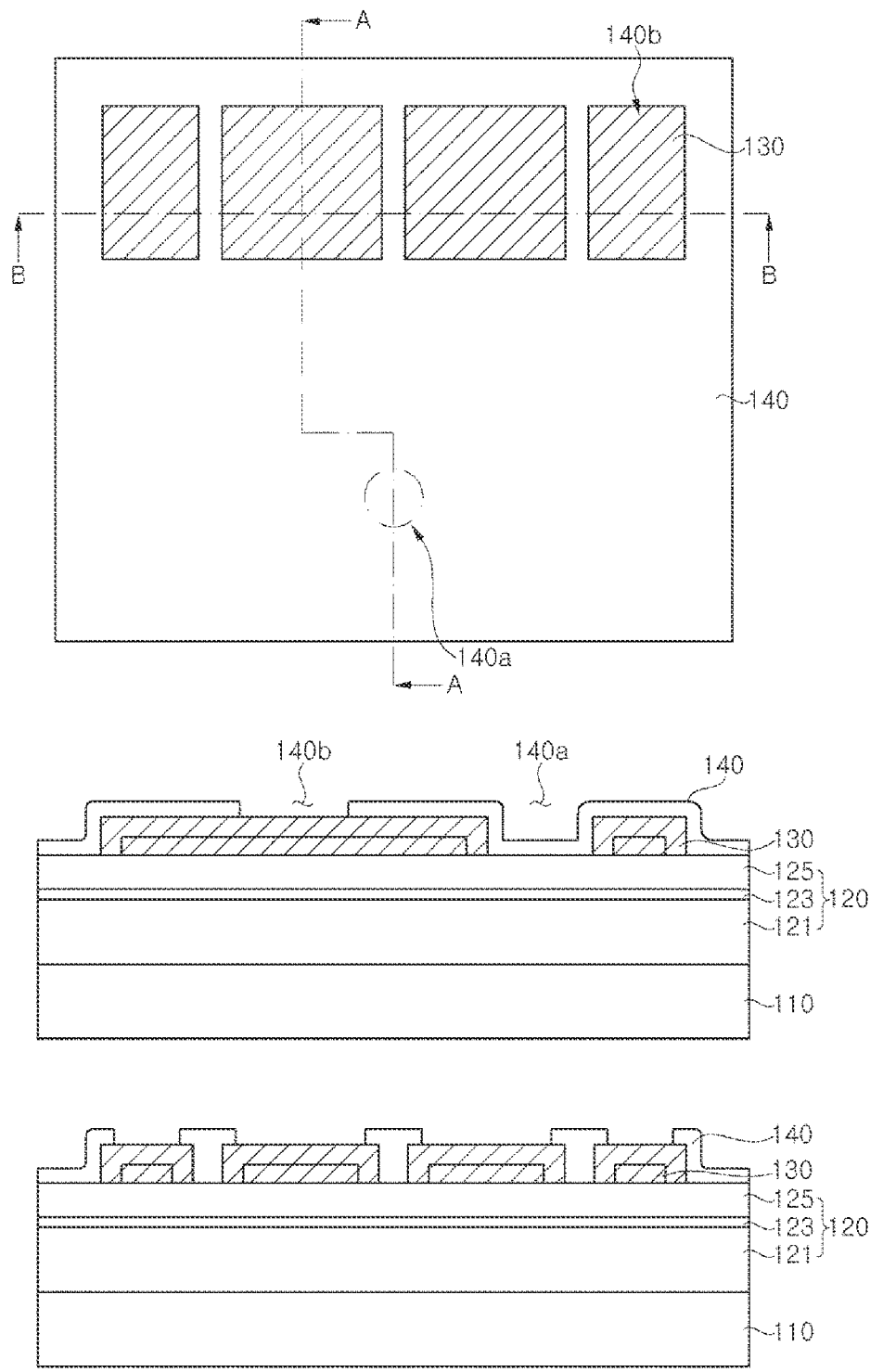

FIG. 2 top figure is a plan view of the light emitting diode according to the one exemplary embodiment, in which a first insulation layer is placed on the reflective electrode layers, FIG. 2 middle figure is a sectional view taken along line A-A of FIG. 2 top figure, and FIG. 2 bottom figure is a sectional view taken along line B-B of FIG. 2 top figure.

Referring to FIG. 2, the reflective pattern layer 130 is covered with the first insulation layer 140. For example, the first insulation layer 140 may be disposed on a side surface and an upper surface of the reflective electrode layer 130a of the reflective pattern layer 130, and a bottom surface of the isolation region 130b. The first insulation layer 140 may have an even thickness or may have different thicknesses depending on regions thereof.

A lower region may be exposed by partially removing the first insulation layer 140. The first insulation layer 140 may include a plurality of second regions 140b that expose the reflective electrode layer 130a. Further, the first insulation layer 140 may include a first region 140a for a via-hole (not shown) which will be formed by a subsequent process. This will be described below.

The first insulation layer 140 may include an insulation material, and may be formed of or include, for example, oxides such as $SiO_2$, nitrides such as SiNx, or insulation materials such as $MgF_2$. In addition, the first insulation layer 140 may be composed of or include multiple layers and may include a distributed Bragg reflector in which materials having different indexes of refraction are alternately stacked one above another. For example, an insulation reflective layer having high reflectivity may be formed by stacking $SiO_2/TiO_2$ layers or $SiO_2/Nb_2O_5$ layers.

The first insulation layer 140 may be formed by chemical vapor deposition (CVD) or the like, and may be subjected to patterning to expose the reflective electrode layers 130a.

Figure 3A:
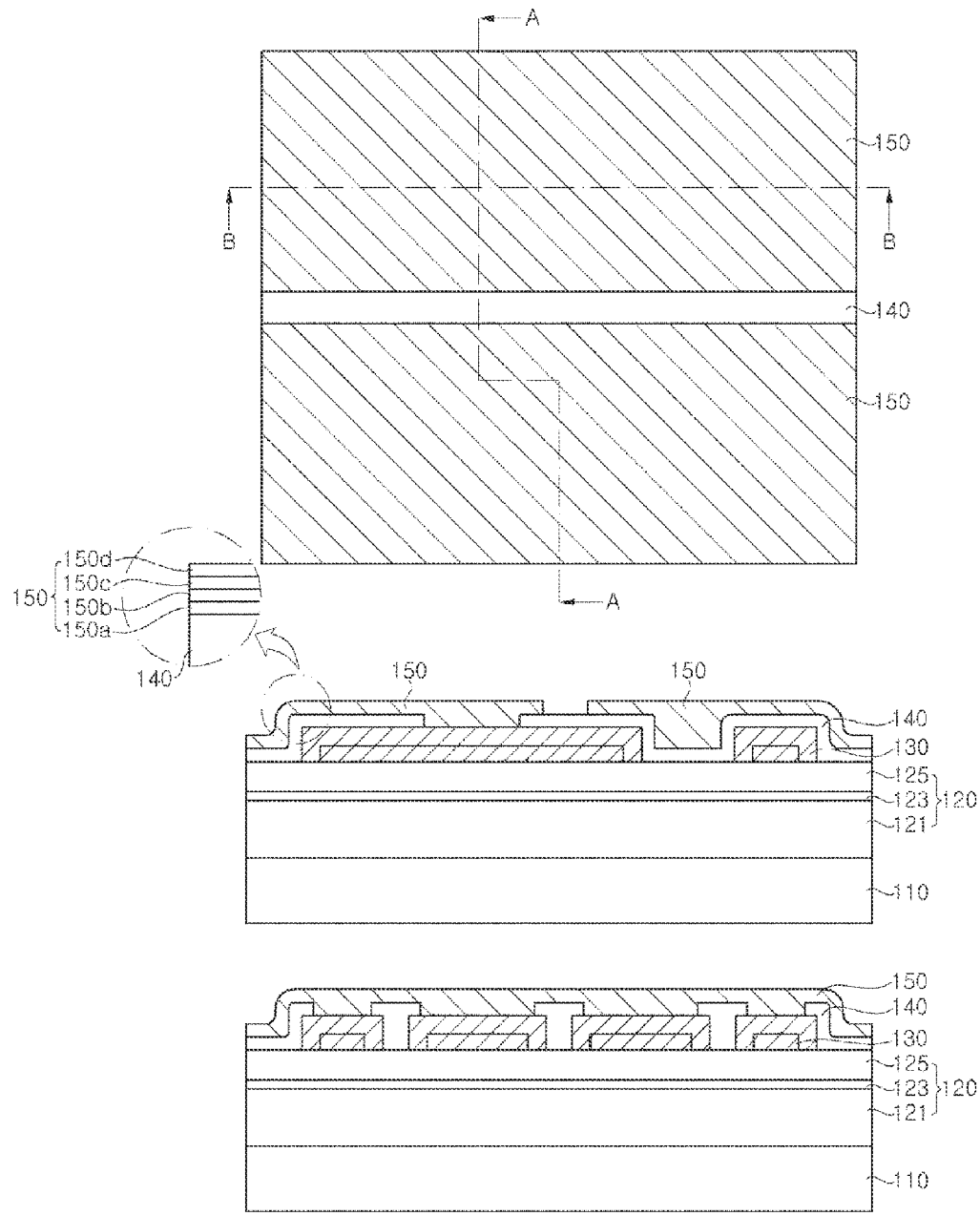

FIG. 3a top figure is a plan view of the light emitting diode according to one exemplary embodiment, in which metal layers are formed on the first insulation layer, FIG. 3a middle figure is a sectional view taken along line A-A of FIG. 3a top figure, and FIG. 3a bottom figure is a sectional view taken along line B-B of FIG. 3a top figure.

Referring to FIG. 3a, a plurality of pad metal layers 150 is formed on the first insulation layer 140. In addition, the pad metal layers 150 may be formed within the first and second regions 140a and 140b. The pad metal layers 150 may be formed substantially over the entirety of an upper surface of the growth substrate 110 excluding a separation region between the pad metal layers. With this structure, the light emitting diode allows electric current to be easily spread through the pad metal layers 150. The pad metal layers 150 may form ohmic contact with the reflective electrode layers 130a through the second regions 140b.

The pad metal layers 150 may include a bonding layer 150a, a metal reflective layer 150b, an anti-diffusion layer 150c, and a seed layer 150d. The bonding layer 150a may include Ti, Cr, Ni, or Ta, or combinations thereof and enhances bonding strength between the pad metal layer 150 and the first insulation layer 140. The metal reflective layer 150b may include Al, or Ag, or combinations thereof and enhances reflectivity of the light emitting diode by reflecting light entering the pad metal layer 150. The anti-diffusion layer 150c may include Cr, Ti, Ni, Mo, TiW, or W, or combinations thereof and protects the metal reflective layer 150b by preventing diffusion of metal elements. The seed layer 150d is formed for the purpose of deposition and plating of lower electrodes (not shown), which will be formed in a subsequent process, and may include Au or Cu. The pad metal layers 150 may be formed through deposition or electroplating.

Figure 3B:
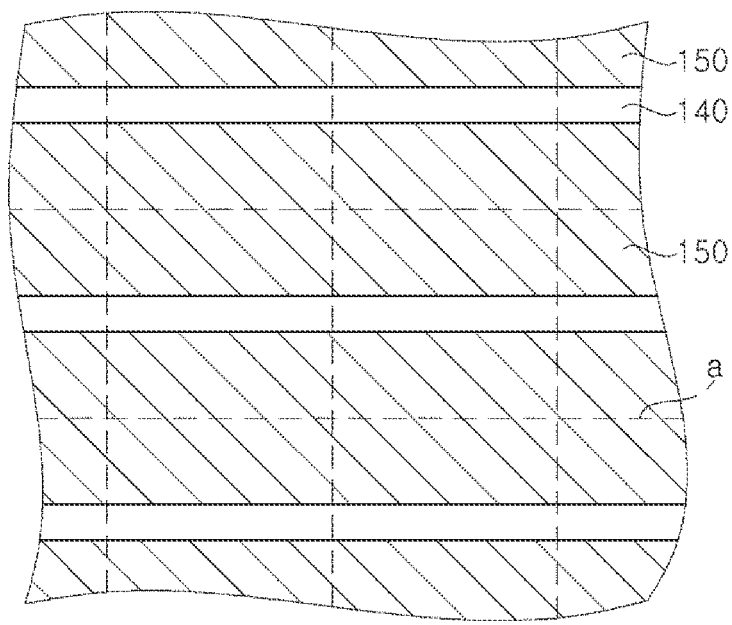

FIG. 3b is a plan view of a part of a wafer before the light emitting diode according to the exemplary embodiment is divided into an individual diode.

Referring to FIG. 3b, the pad metal layers 150 and the first insulation layer 140 are formed in a stripe pattern. For example, the first insulation layer 150 may be exposed between the pad metal layers 150 disposed parallel to each other. Here, a dotted line "a" indicates an isolation line for isolation of a wafer into individual diodes. The isolation line may be formed in the isolation region illustrated in FIG. 1.

Although the pad metal layers 150 may be divided into first and second conductive type pad metal layers along the dotted line "a", the divided layers are electrically connected to each other inside the wafer such that current can flow therebetween upon electroplating.

Figure 4A:
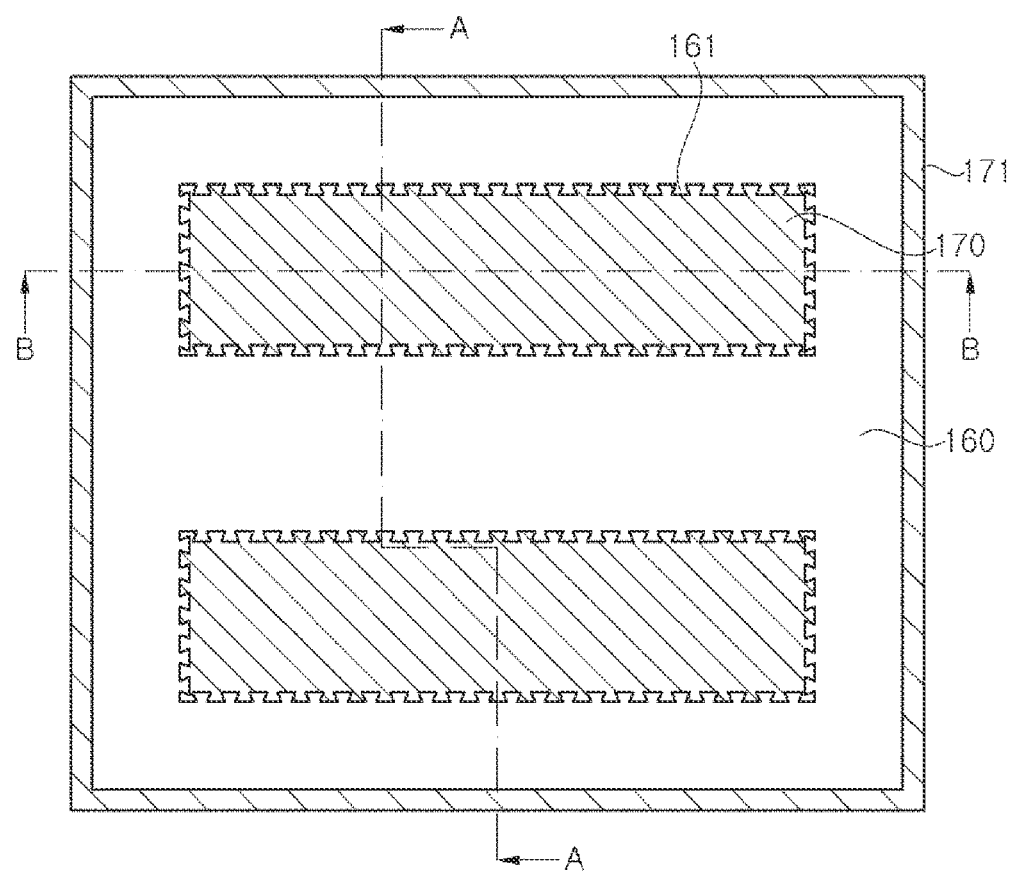
Figure 4B:
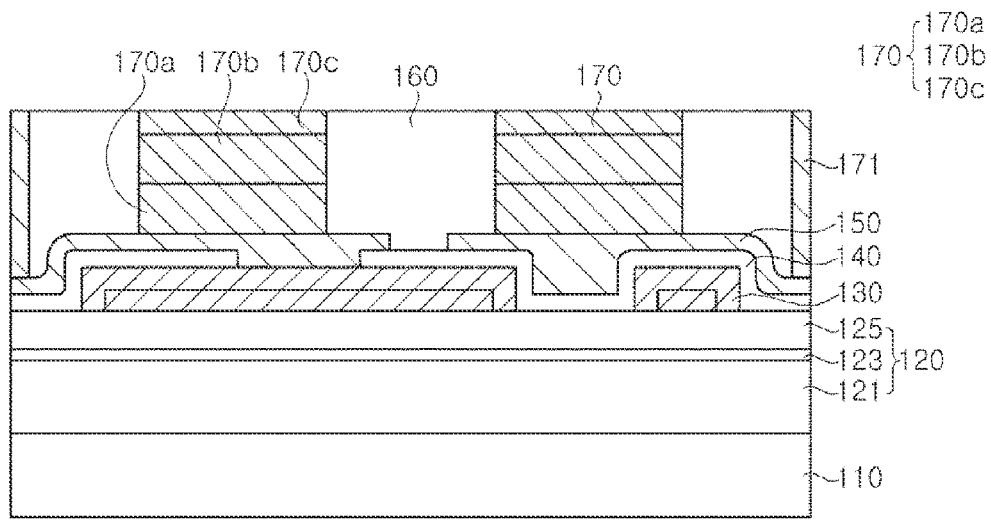
Figure 4B:
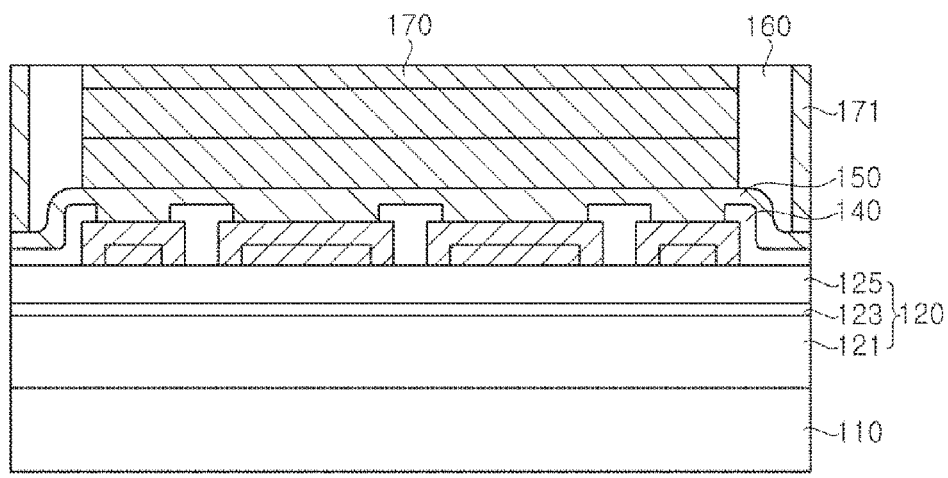

FIG. 4a is a plan view of the light emitting diode according to the exemplary embodiment, in which a mold is formed on the pad metal layers, FIG. 4b top figure is a sectional view taken along line A-A of FIG. 4a, and FIG. 4b bottom figure is a sectional view taken along line B-B of FIG. 4a top figure.

Referring to FIG. 4a and FIG. 4b, a mold 160 and lower electrodes 170 are placed on the pad metal layers 150. The mold 160 includes the lower electrodes 170 in an inner region thereof. The inner region of the mold 160 is coupled to each of the lower electrodes 170 through a fastening region 161. Further, the light emitting diode may further include a support 171 that surrounds the mold 160. The mold 160 includes a fastening element that surrounds the lower electrode 170. The lower electrode 170 also includes a fastening element formed along a periphery thereof and fastened to the fastening element of the mold 160. The fastening element of the mold 160 is fastened to the fastening element of the lower electrode 170 to form the fastening region 161. The fastening pattern of the mold 160 and the fastening pattern of the lower electrode are engaged with each other in the fastening region 161. As shown therein, the fastening region 161 may form a reverse-trapezoidal sawtooth pattern. Alternatively, although not shown, the fastening region 161 may form a triangular sawtooth pattern, a trapezoidal sawtooth pattern, or a rectangular sawtooth pattern, and the like.

Each of the fastening elements of the mold 160 and the lower electrodes 170 may include a plurality of depressions and a plurality of protrusions, which are engaged with each other in the fastening region 161. With this structure, the mold 160 and the lower electrodes 170 can be strongly mechanically fastened to each other.

Furthermore, in order to enhance fastening strength between the mold 160 and the lower electrodes 170, each of the protrusions in the fastening elements of the mold 160 and the lower electrodes 170 has an increasing width in a protruding direction thereof. In addition, each of the protrusions may have a continuously or intermittently increasing width in the protruding direction thereof. Each of the protrusions in the fastening elements of the mold 160 and the lower electrode 170 may have any shape so long as the mold 160 and the lower electrode 170 can be mechanically fastened to each other therethrough.

In addition, the support 171 surrounding the mold 160 enhances structural stability of the light emitting diode during the process while preventing the epitaxial layers 120 from suffering bending or breakage after removal of the growth substrate 110.

The mold 160 may include at least one of photosensitive polyimide, Su-8, photoresist for plating, Parylene, an epoxy molding compound (EMC), or ceramic powder. The mold 160 and/or the lower electrodes 170 may have a height of 20 μm to 200 μm. In addition, an upper surface of the mold 160 may be flush with an upper surface of the lower electrodes 170.

In this exemplary embodiment, the thicknesses of the mold 160 and the lower electrodes 170 may be determined as needed. Thus, the mold 160 and the lower electrodes 170 may be generally formed to have a similar thickness to that of a typical metal plate, whereby the light emitting diode according to the exemplary embodiment can be used in the same application range as that in the related art.

In order to form the lower electrodes 170 in the inner region of the mold 160, the mold 160 is formed to cover the first insulation layer 140 disposed between the pad metal layer 150 and the pad metal layer 150 through deposition and curing. Then, the inner region of the mold 160 is partially removed to form inner open regions through which the pad metal layers 150 are partially exposed. In formation of the inner open region, the mold 160 may be subjected to patterning through exposure and development such that the fastening elements can be formed in the inner region of the mold 160 by the patterning process.

Next, the lower electrodes 170 are formed to fill the inner open regions. The lower electrodes 170 may be formed by deposition, plating or the like. The lower electrodes 170 are formed to contact the metal pad layer 150 while filling the inner open regions, whereby the lower electrodes 170 can be electrically connected to the epitaxial layers 120.

In the light emitting diode according to this exemplary embodiment, the mold 160 includes the fastening element even before the lower electrodes 170 are formed. Thus, each of the lower electrodes 170 can be formed in the inner open regions by plating to include the fastening elements that are naturally engaged with the fastening element of the mold 160.

Each of the lower electrodes 170 may include a conduction layer 170a, a barrier layer 170b, and an anti-oxidation layer 170c. The conduction layer 170a serves to promote current spreading and may include Cu or Ag. The barrier layer 170b prevents diffusion of metal is elements of the lower electrode 170 and may include Ni or Pd. The anti-oxidation layer 170c prevents oxidation of the lower electrode 170 and may include Au and the like, and an oxidation sacrificial layer including Ag and/or Al may be formed instead of the anti-oxidation layer 170c.

Figure 4C:
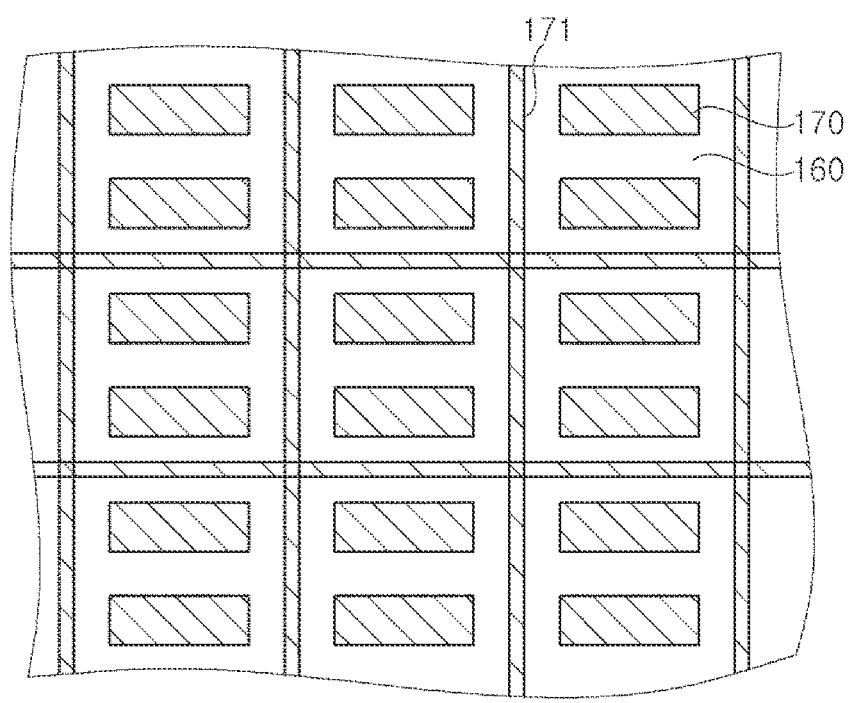

FIG. 4c is a plan view of a part of a wafer before the light emitting diode according to the exemplary embodiment is divided into an individual diode.

Referring to FIG. 4c, the support 171 may be disposed in a region corresponding to the dotted line "a", which indicates the isolation line. The lower electrodes 170 may be formed by taking into account the locations and areas of the pad metal layers 150 placed under the lower electrodes 170. The lower electrodes 170 and the support 171 may be formed by the same process. That is, the mold 160 including no open region is formed on the pad metal layers 150, and some region of the mold 160 is subjected to patterning to expose some of the pad metal layers 150 and the first insulation layer 140. The patterned region of the mold 160 may be an isolation region including the isolation line. With this process, the open region may be filled with the lower electrodes 170 through deposition and curing of a material for the lower electrodes 170. Accordingly, the lower electrodes 170 and the support 171 may be formed of or include the same material by the same process.

FIG. 5a to FIG. 6d are views of the first conductive type semiconductor layer 121 after the removal of the growth substrate 110, in which the first conductive type semiconductor layer 121 is disposed to face upward. Thus, in this exemplary embodiment, the mold 160 and the lower electrodes 170 are placed under the epitaxial layers 120.

Figure 5A:
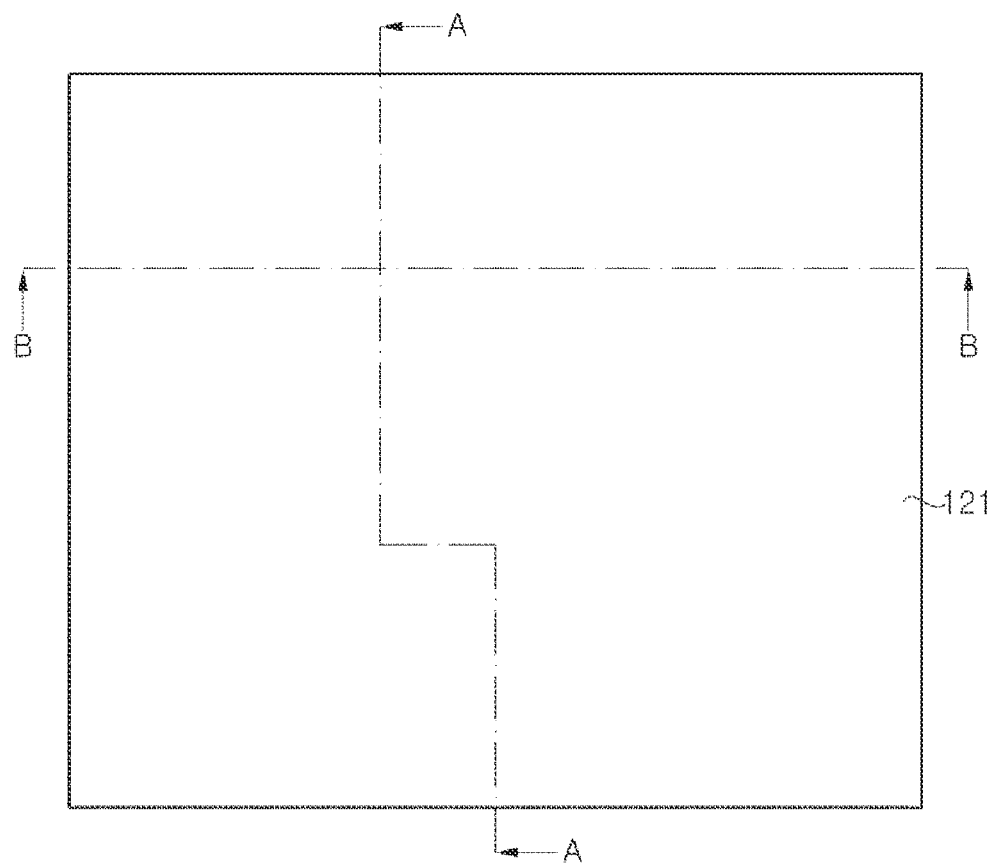
Figure 5B:
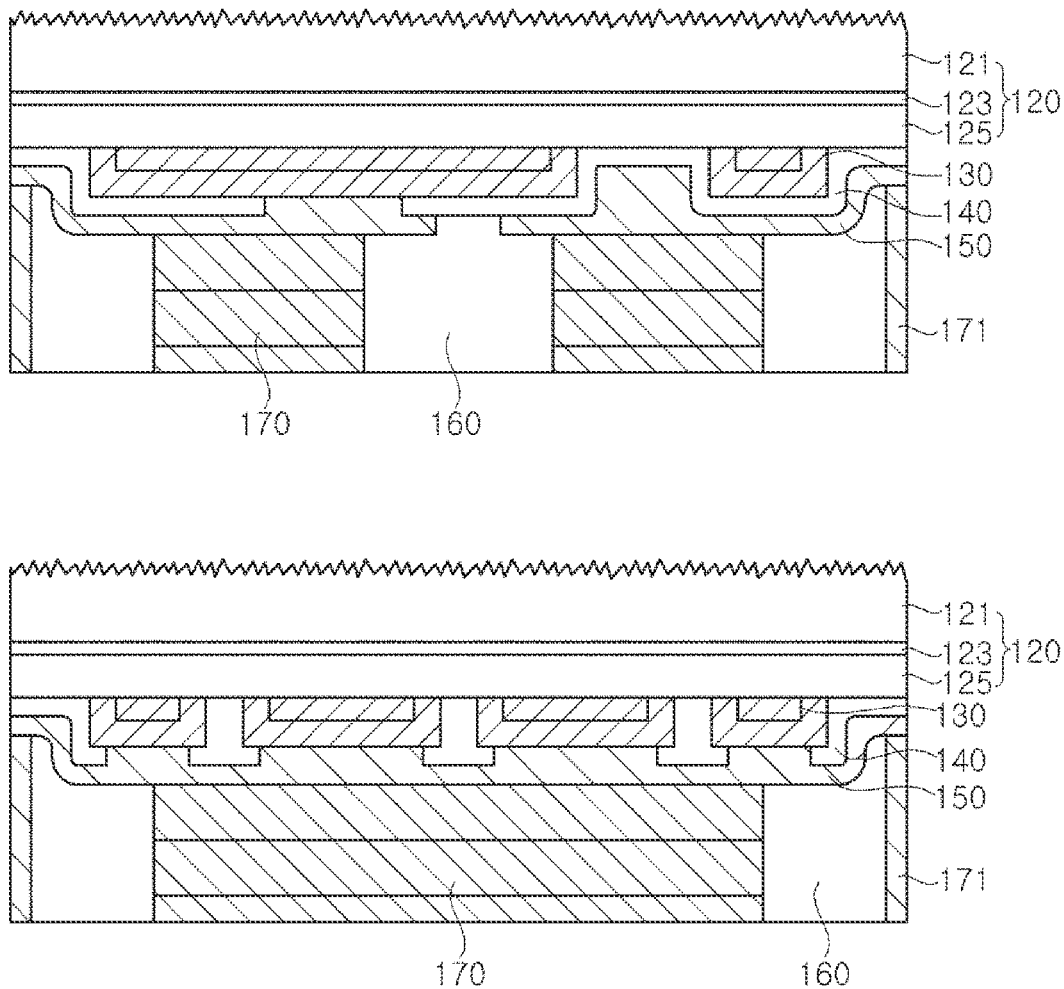

FIG. 5a is a plan view of the epitaxial layer of the light emitting diode according to the exemplary embodiment, from which the growth substrate is separated, FIG. 5b top figure is a sectional view taken along line A-A of FIG. 5a, and FIG. 5b bottom figure is a sectional view taken along line B-B of FIG. 5a.

Figure 5C:
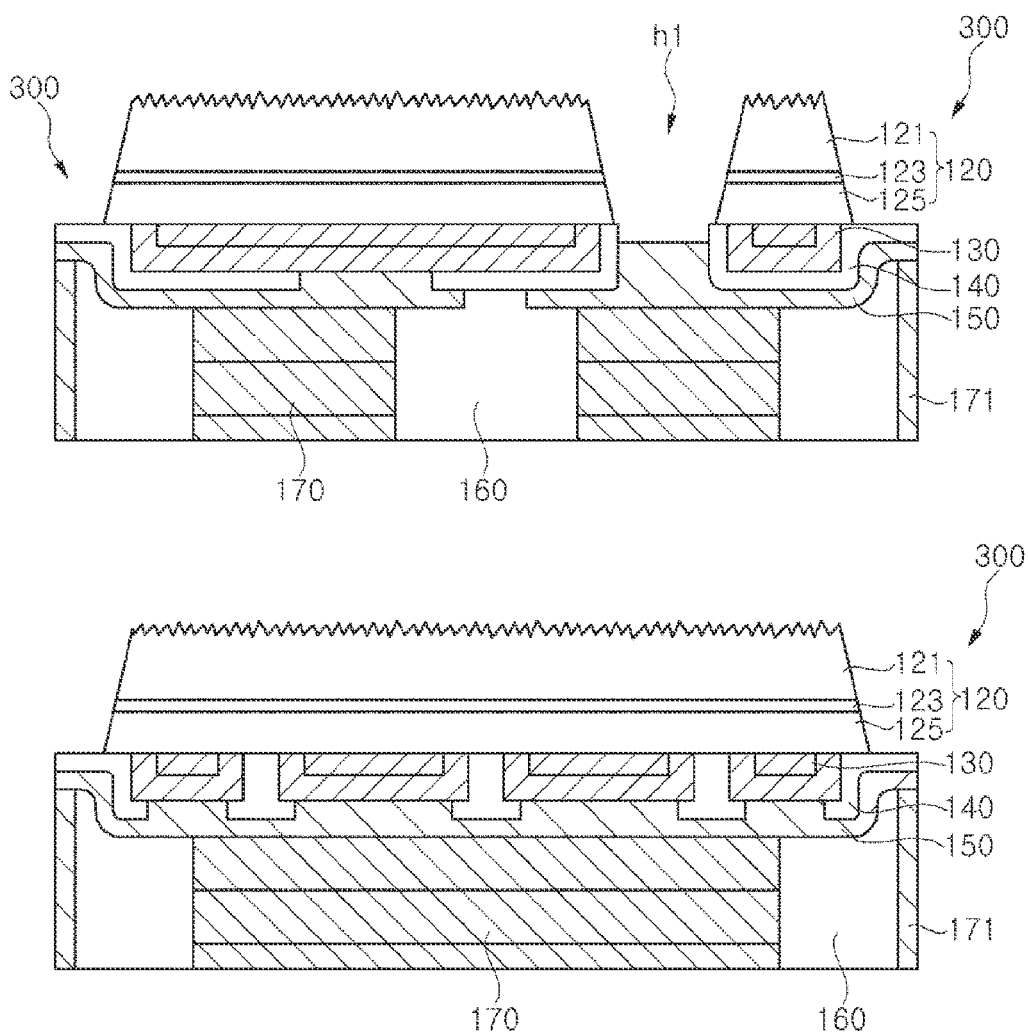

FIG. 5c top figure is a sectional view taken along line A-A of FIG. 5a after formation of a light emitting structure and FIG. 5c bottom figure is a sectional view taken along line B-B of FIG. 5a after formation of the light emitting structure.

Referring to FIG. 5a and FIG. 5b, the growth substrate 110 is separated from the epitaxial layers 120. The growth substrate 110 may be separated from the epitaxial layers 120 using any of various methods including laser lift-off, chemical lift-off, stress lift-off, or thermal lift-off, and the like.

An exposed surface of the lower electrodes 170 may be flattened through chemical mechanical polishing. In addition, roughness may be formed on a surface of the first conductive type semiconductor layer 121 exposed by separation of the growth substrate 110. In addition, before formation of the roughness, remaining materials on the surface of the first conductive type semiconductor layer 121 may be chemically or mechanically removed, and the first conductive type semiconductor layer 121 may be removed to a certain thickness from the surface thereof. During separation of the growth substrate 110, defects or damage can occur around the surface of the first conductive type semiconductor layer 121. Accordingly, the surface of the first conductive type semiconductor layer 121 may be removed to a certain thickness, thereby improving overall crystallinity of the first conductive type semiconductor layer 121.

The roughness may be formed by wet etching using a KOH and/or NaOH solution, or a sulfuric/phosphoric acid solution, and the like. Alternatively, the roughness may be formed by photo-enhanced chemical (PEC) etching, other wet etching methods, dry etching, or electrolysis. The roughness formed on the surface of the first conductive type semiconductor layer 121 can enhance light extraction efficiency of the light emitting diode.

In the light emitting diode according to the exemplary embodiment, the mold 160 and the lower electrodes 170 mechanically fastened to each other act as a support substrate instead of a metal substrate, thereby minimizing a bowing phenomenon of the epitaxial layers 120, which can occur during separation of the growth substrate 110. In the light emitting diode with this structure, stress applied to the epitaxial layers 120 can be minimized, thereby preventing damage to the epitaxial layers 120 after separation of the growth substrate 110. Accordingly, the light emitting diode according to the exemplary embodiment includes the epitaxial layers 120 having good crystal quality with minimized defects, thereby providing high reliability and efficiency.

Next, referring to FIG. 5c, a light emitting structure may be formed by patterning the epitaxial layers 120. In addition, an isolation region 300 of the wafer may be formed by patterning the epitaxial layers 120.

Patterning may be performed by dry etching and the like. The epitaxial layers 120 may be divided into at least one light emitting diode through formation of the isolation region 300. Together with the patterning process, a via-hole h1 may be formed such that the pad metal layers 150 are exposed therethrough. The via-hole h1 may be formed in the first region 140a described in the exemplary embodiment of FIG. 2. In this exemplary embodiment, the via-hole h1 is formed by removing a region of the first insulation layer 140 in which the via-hole h1 will be formed, whereby the pad metal layers 150 are exposed through the via-hole h1. The first insulation layer 140 in the first region 140a is removed during formation of the via-hole h1, thereby preventing damage to the epitaxial layers 120.

The via-hole h1 may have a polyprism shape including a reverse truncated pyramidal shape, a reverse truncated conical shape, a cylindrical shape, or a square pillar shape. In this exemplary embodiment, the via-hole has a reverse truncated conical shape, without being limited thereto.

Figure 6A:
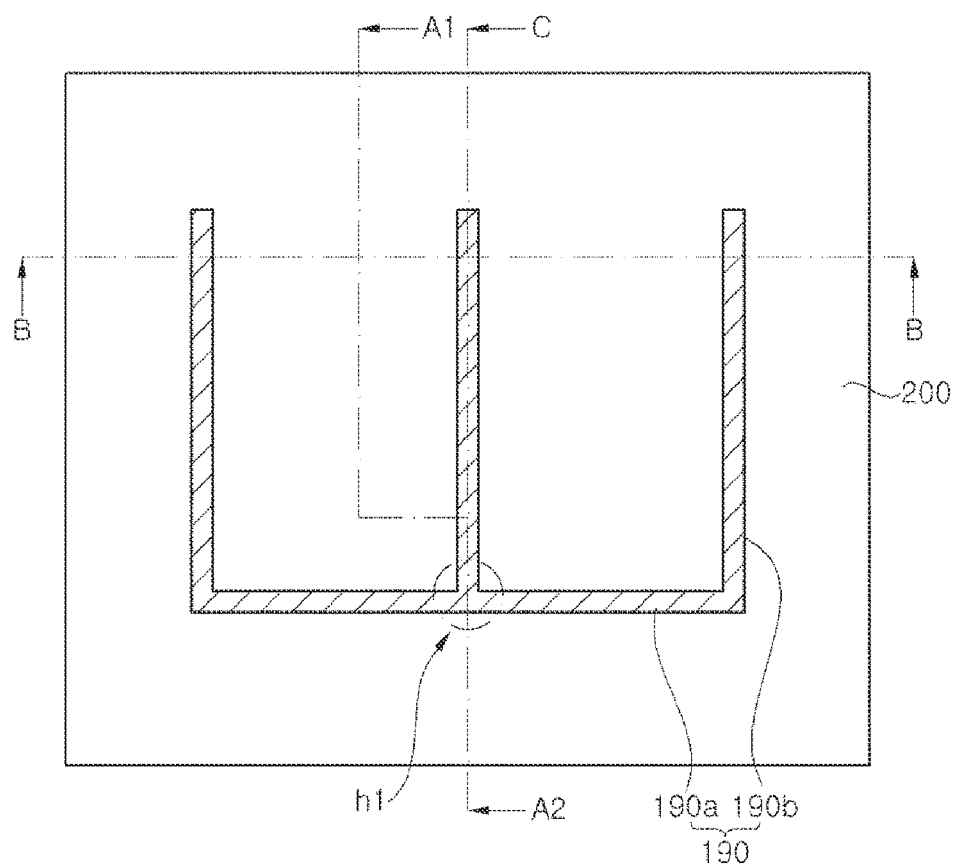
Figure 6B:
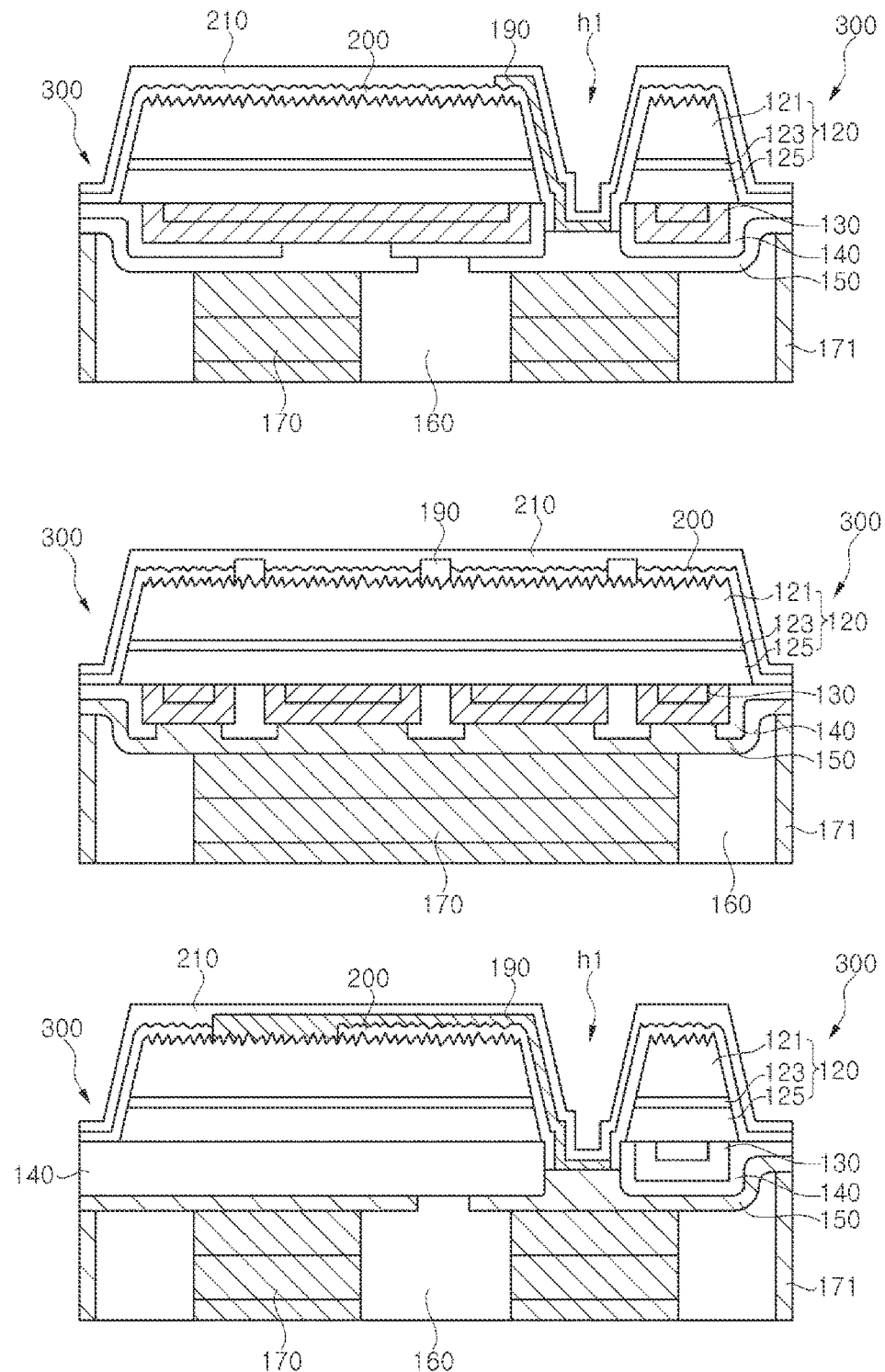

FIG. 6a is a plan view of the light emitting structure including a second insulation layer in the light emitting diode according to the exemplary embodiment, FIG. 6b top figure is a plan view taken along line A1-A2 of FIG. 6a, FIG. 6b middle figure is a sectional view taken along line B-B of FIG. 6a, and FIG. 6b bottom is a sectional view taken along line C-A1 of FIG. 6a.

Referring to FIG. 6a and FIG. 6b, an electrode pattern 190 may be formed on an upper surface and a side surface of the light emitting structure 120. The electrode pattern 190 may include a plurality of extensions extending from one side to the other side of the light emitting structure 120. The electrode pattern 190 may have a reflective structure including Al or Ag. In the electrode pattern 190, the plurality of extensions may include a reflective layer. The reflective layer of the plurality of extensions may include Al or Ag. With this structure, the light emitting diode can have improved light extraction efficiency. Further, the electrode pattern 190 may include a multilayer structure of Cr/Au.

To form the electrode pattern 190, first, a second insulation layer 200 is formed to cover an overall upper surface of the wafer. Then, some region of the second insulation layer 200 is opened such that a portion of the pad metal layers 150 in the via-hole h1 is exposed therethrough. In addition, a portion of the second insulation layer 200 corresponding to some region of an upper surface of the first conductive type semiconductor layer 121 to be connected to a portion of the electrode pattern 190 is opened. Then, the portion of the pad metal layers 150 in the via-hole h1 exposed by this process is electrically connected to the region of the upper surface of the first conductive type semiconductor layer 121 through the electrode pattern 190. The electrode pattern 190 may form ohmic contact with the first conductive type semiconductor layer. Then, an upper surface of the electrode pattern 190 is covered with a third insulation layer 210. The third insulation layer 210 may be used to protect the electrode pattern 190. The third insulation layer 210 may be formed on the overall upper surface of the light emitting structure 120 including the upper surface of the electrode pattern 190. The second and third insulation layers 200 and 210 may be transparent insulation layers.

In this exemplary embodiment, the electrode pattern 190 has a shape corresponding to the isolation region 130b shown in FIG. 1. In some implementations, the electrode pattern 190 is disposed to overlap the first insulation layer 140 formed in the isolation region 130b.

The electrode pattern 190 may include a first extension 190a extending in opposite lateral directions with respect to the via-hole h1 and a second extension 190b perpendicular to the first extension 190a. The second extension 190b may include a reflective layer including Ag or Al, and the first extension 190a may also include the reflective layer.

The length and number of first and second extensions 190a and 190b may be determined depending upon the number of extensions of the isolation region 130b disposed in a lower region. Accordingly, in this exemplary embodiment, at least some region of the isolation region 130b may overlap the electrode pattern 190 disposed in an upper region.

In this exemplary embodiment, since the first insulation layer 140 is placed between the electrode pattern 190 and at least one of the lower electrodes 170, the light emitting diode can prevent electric current from directly flowing from the first conductive type semiconductor layer 121 to the second conductive type semiconductor layer 125 in the light emitting structure 120, thereby improving current spreading performance.

Figure 6C:
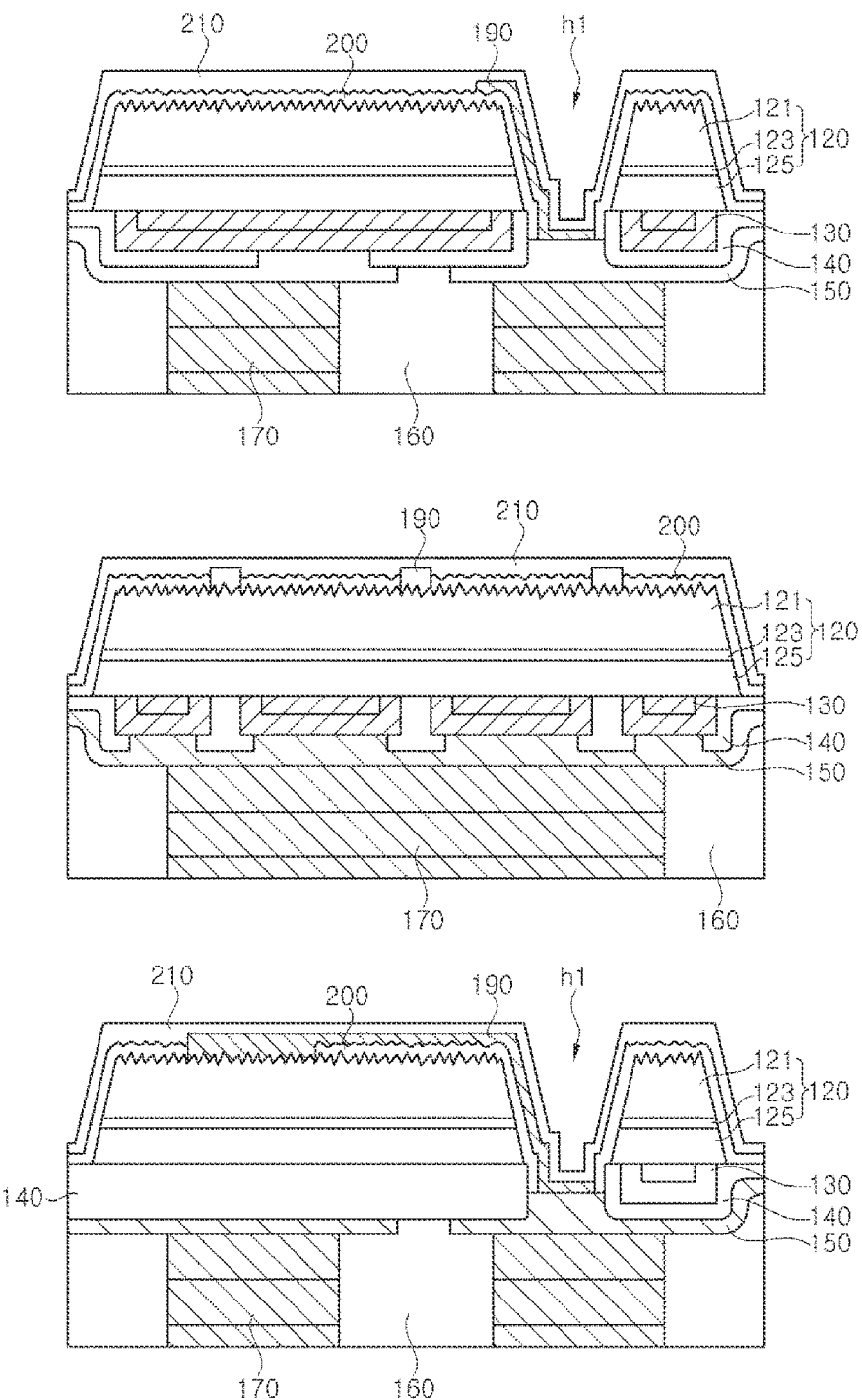

Then, a process of dividing the wafer into individual diodes is performed by taking into account the isolation region 300 formed by patterning. Together with this process, the support 171 disposed in the isolation region 300 may also be removed. As a result, a light emitting diode according to one exemplary embodiment may be formed as shown in FIG. 6c.

In addition, although not shown in the drawings, in the process of forming the light emitting structure 120 through patterning, patterning is performed such that side end regions of the pad metal layers 150 are not exposed to the outside, and the pad metal layers 150 may be covered with the second and third insulation layers 200 and 210. With this process, it is possible to prevent the pad metal layers 150 from contacting external environments.

Figure 6D:
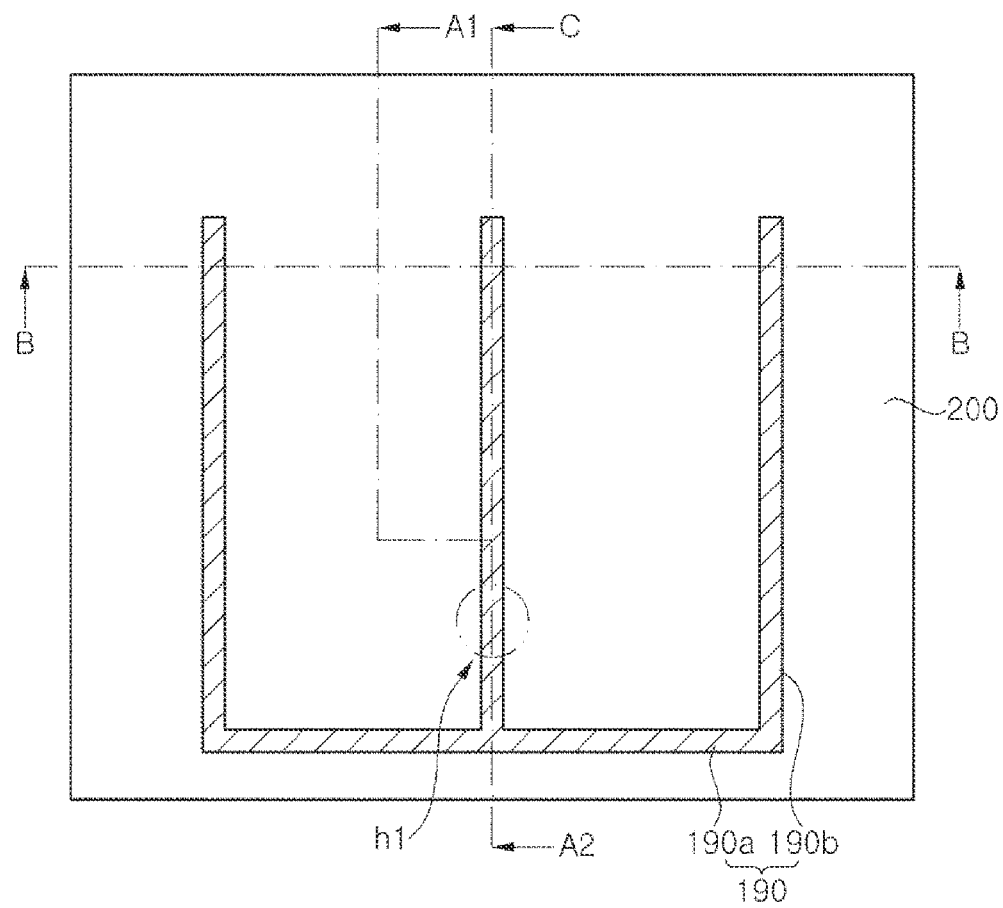

FIG. 6d is a plan view of an electrode pattern according to another exemplary embodiment. The light emitting diode of the embodiment shown in FIG. 6d is the same as that of the embodiment shown in FIG. 6a and differs in the shape of the electrode pattern. The repeated description will be omitted for the same configurations.

Referring to FIG. 6d, the electrode pattern 190 may include a first extension 190a extending in opposite lateral directions and a second extension 190b perpendicular to the first extension 190a.

In this exemplary embodiment, the first extension 190a extends in the opposite lateral directions while being close to one side of the light emitting diode. Such configuration differs from the extension of the first extension 190a in the opposite lateral directions from the via-hole h1. The first extension 190a may be disposed on an outer circumference of the light emitting structure 120 instead of being placed on the light emitting structure 120. With this structure, the light emitting diode can prevent the electrode pattern 190 from blocking light generated in the active layer 123, thereby improving light extraction efficiency. Although the shape of the electrode pattern 190 is illustrated in FIG. 6a and FIG. 6d, it should be understood that other implementations are also possible.

In one exemplary embodiment, although not shown in the drawings, before or after the wafer is divided into individual diodes, a wavelength conversion layer may be deposited or coated onto a wafer or an individual light emitting diode having the second and third insulation layers 200 and 210 thereon, and may have a uniform thickness. The wavelength conversion layer may contain or include a resin and phosphors for conversion of light generated in the active layer 123. The phosphors may be mixed with the resin and randomly or evenly disposed in the wavelength conversion layer.

The resin may include a polymer resin such as an epoxy resin or an acryl resin, or a silicone resin, and may act as a matrix in which the phosphors are dispersed. The phosphors may include various phosphors well-known to those skilled in the art, and may include any phosphors including garnet phosphors, aluminate phosphors, sulfide phosphors, oxynitride phosphors, nitride phosphors, fluoride phosphors, or silicate phosphors, without being limited thereto.

The wavelength conversion layer may be deposited or coated by any of various methods including aerosol spraying, pulsed laser deposition (PLD), printing, or spin-on-glass (SOG) coating, and the like.

Further, in one exemplary embodiment, although not shown in the drawings, before or after the wafer is divided into individual diodes, an optical glass lens may be deposited or coated onto a wafer or an individual light emitting diode having the second and third insulation layers 200 and 210 thereon. The optical glass lens can adjust a beam angle of light generated in the active layer 123. Further, a secondary optical lens may be formed on the light emitting diode using an optical glass lens in the form of a micro lens or a Fresnel lens. The optical glass lens may be bonded to the light emitting diode using SOG or a transparent organic material as a bonding agent. Use of the optically transparent SOG or the transparent organic material can reduce light loss. Furthermore, the optical glass lens may be formed after formation of the wavelength conversion layer on the light emitting diode.

In the exemplary embodiment, the light emitting diode may be directly mounted on a printed circuit board through the lower electrodes 170 surrounded by the mold 160, and prevents the side surfaces of the lower electrodes 170 from being exposed to the outside, thereby preventing metal elements such as tin (Sn) in the solder paste from diffusing into the light emitting diode.

Although some exemplary embodiments have been illustrated in conjunction with the drawings, it will be apparent to those skilled in the art that various modifications, changes and substitutions can be made. Therefore, it should be understood that these embodiments and the accompanying drawings are provided as examples only, and are given to facilitate understanding of various implementations of the disclosed technology.

FIG. 7 to FIG. 11e are plan views and sectional views illustrating a light emitting diode and a method of fabricating the same according to one exemplary embodiment of the disclosed technology.

Figure 7:
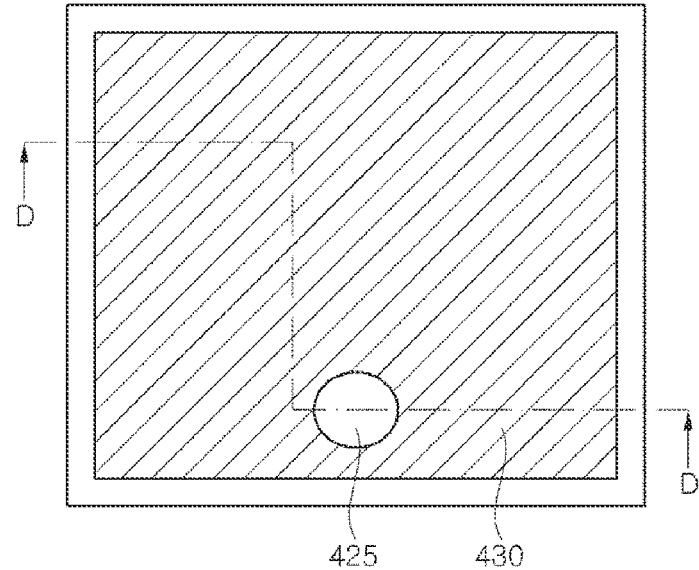
FIG. 7 to FIG. 11e are plan views and sectional views illustrating a light emitting diode and a method of fabricating the same according to one exemplary embodiment of the disclosed technology.
Figure 7:
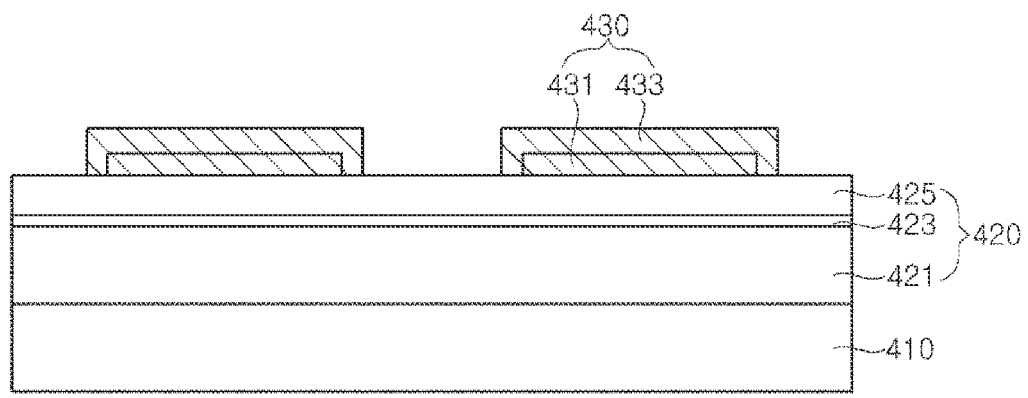

FIG. 7 top figure is a plan view of a growth substrate of a light emitting diode according to one exemplary embodiment, in which a reflective electrode layer is formed on an epitaxial layer and FIG. 7 bottom figure is a sectional view taken along line D-D in top figure of FIG. 7.

Referring to FIG. 7, first, a growth substrate 410 is prepared and epitaxial layers 420 are formed on the growth substrate 410. The growth substrate 410 may be any substrate allowing growth of the epitaxial layers 420 thereon without limitation, and may include, for example, a sapphire substrate, a silicon substrate, a silicon carbide substrate, a spinel substrate, or a nitride substrate. In this exemplary embodiment, the growth substrate 410 may be or include a sapphire substrate.

When the growth substrate 410 is formed of or includes a different material than that of the epitaxial layers 420 to be grown on the growth substrate 410, for example, when the epitaxial layers 420 include a nitride semiconductor and the growth substrate 410 is a heterogeneous substrate such as a sapphire substrate, the light emitting diode according to this embodiment may further include a buffer layer (not shown) on the growth substrate 410.

Further, the growth substrate 410 may include a variety of growth planes, for example, a polar growth plane such as a c-plane (0001), a non-polar growth plane such as an m-plane (1-100) or an a-plane (11-20), or a semi-polar growth plane such as a (20-21) plane. Alternatively, the growth substrate 410 may be a patterned substrate.

A first conductive type semiconductor layer 421, an active layer 423 and a second conductive type semiconductor layer 425 are grown on the growth substrate 110.

The first conductive type semiconductor layer 421 may include, for example, an n-type GaN-based semiconductor layer and the second conductive type semiconductor layer 425 may include a p-type GaN-based semiconductor layer. Further, the active layer 423 may have a single quantum well structure or a multi-quantum well structure, and may include a well layer and a barrier layer. Further, the composition of the well layer may be determined depending upon a desired wavelength of light, and may include, for example, InGaN.

The first conductive type semiconductor layer 421 and the second conductive type semiconductor layer 425 may be different conductive type semiconductor layers, and the semiconductor layers 421, 423, 425 may be formed by various deposition and growth methods including metal organic chemical vapor deposition (MOCVD), molecular beam epitaxy (MBE), hydride vapor phase epitaxy (HVPE), and the like.

Herein, the explanations of well-known techniques relating to the semiconductor layers will be omitted.

Then, reflective electrode layers 430 are formed by suitable technologies such as a lift-off technology. The reflective electrode layers 430 are formed to allow the second conductive type semiconductor layer 425 to be exposed through some region of the reflective electrode layers 430. The second conductive type semiconductor layer 425 exposed through some region of the reflective electrode layers 430 may be electrically connected to an electrode pattern by a subsequent process. Details of this process will be described below. Thus, the area and location of the region of the second conductive type semiconductor layer 425 exposing the second conductive type semiconductor layer 425 are determined by taking into account the electrical connection to the electrode pattern. Although it has been illustrated in this exemplary embodiment that the second conductive type semiconductor layer 425 is exposed in a circular shape adjacent to one side of the growth substrate 410, it should be understood that other implementations are also possible.

The reflective electrode layers 430 may include a reflective metal layer 431 and a capping metal layer 433. The reflective metal layer 431 includes a reflective layer and a stress relief layer may be disposed between the reflective metal layer 431 and the capping metal layer 433. The stress relief layer relieves stress due to a difference in coefficient of thermal expansion between the reflective metal layer 431 and the capping metal layer 433.

The reflective metal layer 431 may be formed of or include, for example, Ni/Ag/Ni/Au, and may have a total thickness of about 1600 Å. The reflective metal layer 431 may have an inclined side surface, for example, a structure in which a bottom surface has a larger area than an upper surface. Such a reflective metal layer 431 may be formed by e-beam evaporation.

The capping metal layer 433 covers upper and side surfaces of the reflective metal layer 431 to protect the reflective metal layer 431. The capping metal layer 433 may be formed by sputtering or by e-beam evaporation (for example, planetary e-beam evaporation) in which the growth substrate 410 is rotated in a tilted state during vacuum deposition. The capping metal layer 433 may include Ni, Pt, Ti, or Cr, and may be formed by depositing, for example, about 5 pairs of Ni/Pt or about 5 pairs of Ni/Ti. Alternatively, the capping metal layer 433 may include TiW, W, or Mo.

The stress relief layer may be formed of or include a material selected in various ways depending upon the metallic materials of the reflective metal layer 431 and the capping metal layer 433. For example, when the reflective metal layer 431 includes Ag, Al, or Al alloys and the capping metal layer 433 includes W, TiW or Mo, the stress relief layer may be or include a single layer of Ag, Cu, Ni, Pt, Ti, Rh, Pd or Cr, or a composite layer of Cu, Ni, Pt, Ti, Rh, Pd or Au. Further, when the reflective metal layer 431 includes Ag, Al or Al and the capping metal layer 433 includes Cr, Pt, Rh, Pd or Ni, the stress relief layer may be or include a single layer of Ag or Cu, or a composite layer of Ni, Au, Cu or Ag.

In addition, although not shown in the drawings, the reflective electrode layers 430 may further include an anti-reflection metal layer. The anti-reflection metal layer may cover the capping metal layer 433 and may include Au in order to prevent oxidation of the capping metal layer 433. For example, the anti-oxidation layer may be formed of or include Au/Ni or Au/Ti. Ti exhibits good adhesion to an oxide layer such as SiO$_2$ and thus is preferred. The anti-reflection metal layer may also be formed by sputtering or by e-beam evaporation (for example, planetary e-beam evaporation) in which the substrate 410 is rotated in a tilted state during vacuum deposition.

After deposition of the reflective electrode layers 430, the photoresist pattern is removed and thus the reflective electrode layers 430 are formed on the second conductive-type semiconductor layer 425, as shown in FIG. 7.

FIG. 7 shows a part of a wafer before wafer division. The part of the wafer may correspond to a unit diode area in which a light emitting diode according to exemplary embodiments will be formed. In this case, a region between both ends of the growth substrate 410 and the epitaxial layer 420 in which the reflective electrode layers 430 are not formed may be an isolation region. It should be noted that the drawings illustrating the following exemplary embodiments of the disclosed technology show the unit diode region unless otherwise specified.

Figure 8:
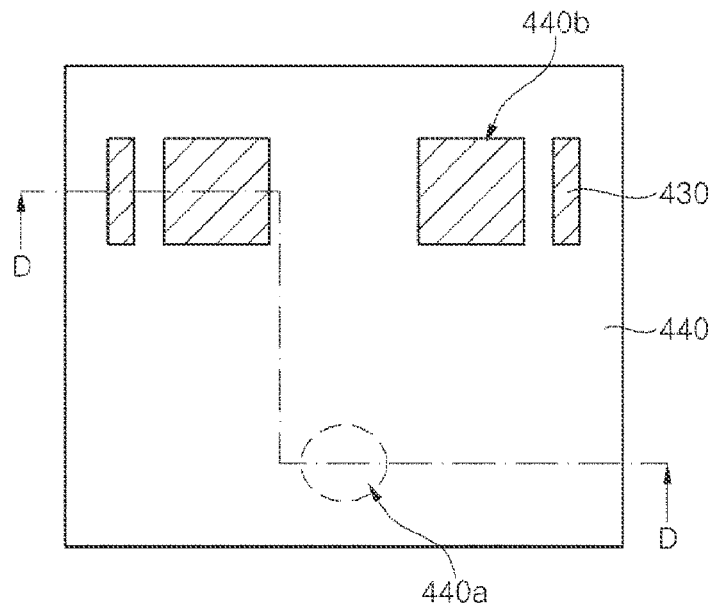
Figure 8:
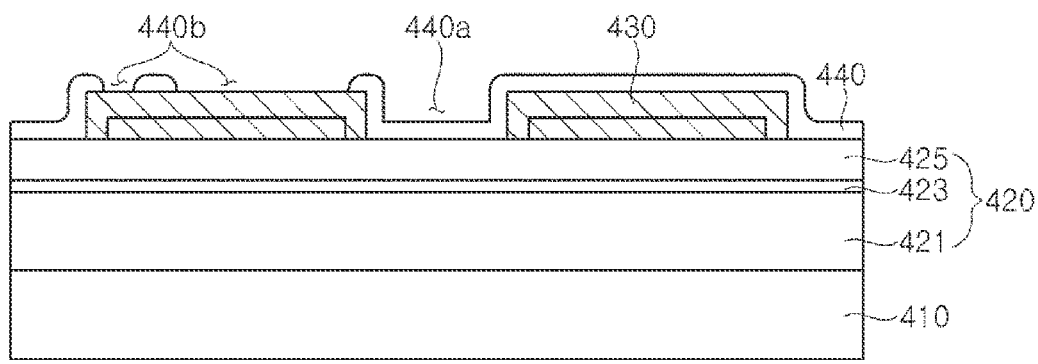

FIG. 8 top figure is a plan view of the reflective electrode layers having a first insulation layer formed thereon and FIG. 8 bottom figure is a sectional view taken along line D-D of FIG. 8 top figure.

Referring to FIG. 8, the reflective electrode layers 430 are covered with a first insulation layer 440. Then, a portion of the first insulation layer 440 is removed to expose a lower region. The first insulation layer 440 includes a plurality of second regions 440b through which the reflective electrode layers 430 are partially exposed. The plural second regions 440b may be separated by a constant distance from each other. Each of the plural second regions 440b is separated by a constant distance from a first region 440a. The constant distance may be determined by taking into account current spreading of the light emitting diode according to the exemplary embodiment. The first region 440a may be or provide a region in which a via-hole will be formed by a subsequent process.

The second regions 440b have a predetermined area opened by taking into account the reflective electrode layers 430 under the second regions. The first insulation layer 440 may have an even thickness or may have different thicknesses depending on regions thereof.

The first insulation layer 440 may include an insulation material, and may be formed of or include, for example, oxides such as SiO$_2$, nitrides such as SiNx, or insulation materials such as MgF$_2$. In addition, the first insulation layer 440 may be composed of or include multiple layers and may include a distributed Bragg reflector in which materials having different indexes of refraction are alternately stacked one above another. For example, an insulation reflective layer having high reflectivity may be formed by stacking SiO$_2$/TiO$_2$ layers or SiO$_2$/Nb$_2$O$_5$ layers.

The first insulation layer 440 may be formed by chemical vapor deposition (CVD), e-beam deposition, or the like, and may be subjected to patterning to form the second regions 440b.

Figure 9A:
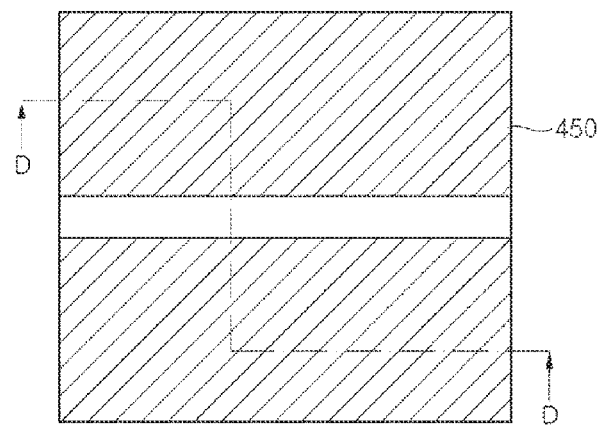
Figure 9A:
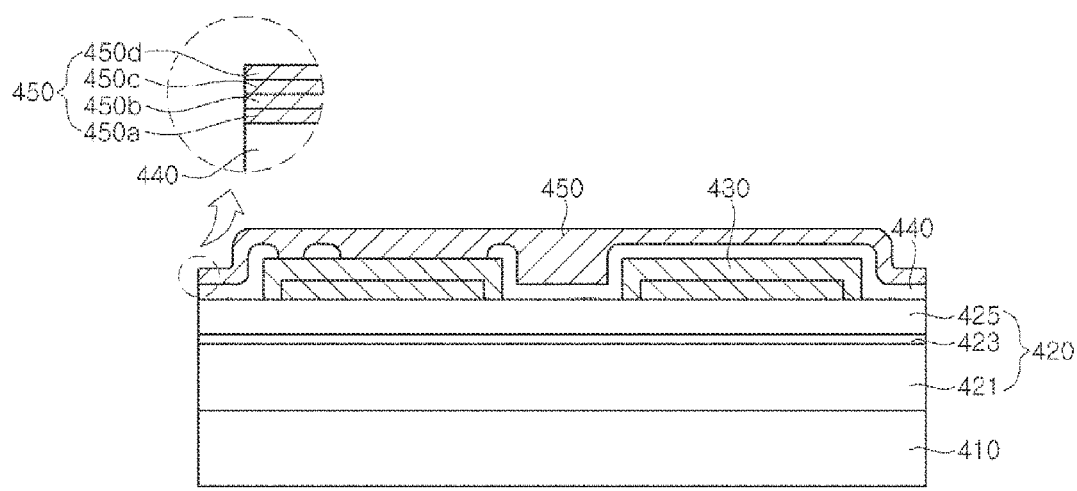
Figure 11A:
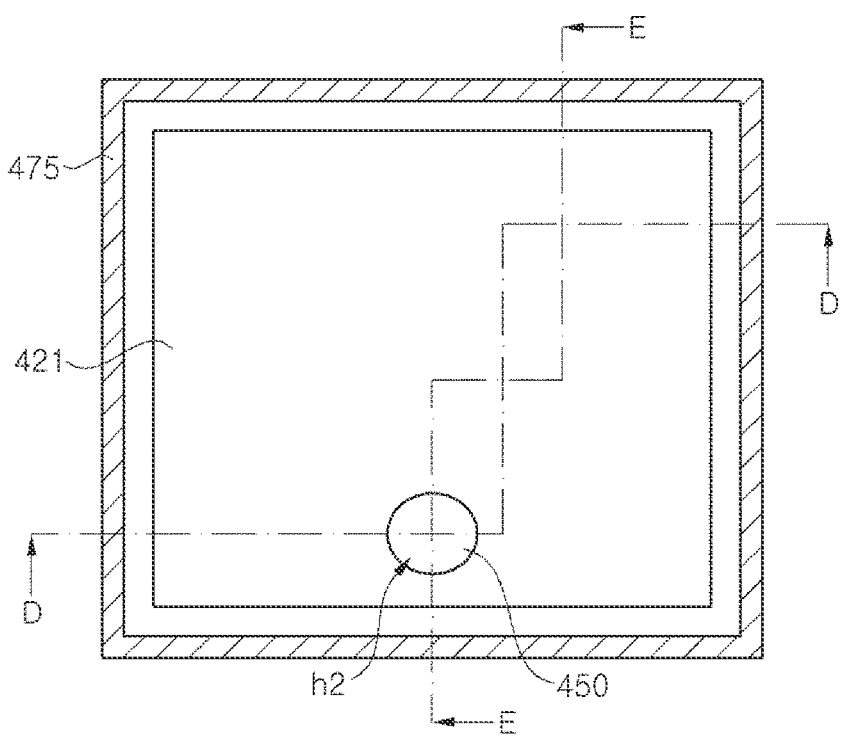

FIG. 9a top figure is a plan view of the first insulation layer on which metal layers are formed, and FIG. 9a bottom figure is a sectional view taken along line D-D of FIG. 11a (a).

Referring to FIG. 9a, a plurality of pad metal layers 450 are formed on the first insulation layer 440. The pad metal layers 450 may be placed on the first and second regions 440a and 440b. The pad metal layers 450 are formed substantially over the entirety of an upper surface of the growth substrate 410 excluding a separation region between the metal layers. With this structure, the light emitting diode allows electric current to be easily spread through the pad metal layers 450. The pad metal layers 450 may form ohmic contact with the reflective electrode layers 430 through the second regions 140b.

The pad metal layers 450 may include a bonding layer 450a, a metal reflective layer 450b, an anti-diffusion layer 450c, and a seed layer 450d. The bonding layer 450a may include Ti, Cr, Ni, or Ta, or combinations thereof and enhances bonding strength between the pad metal layers 450 and the first insulation layer 440. The metal reflective layer 450b may include Al, or Ag, or combinations thereof and enhances reflectivity of the light emitting diode by reflecting light entering the pad metal layers 450. The anti-diffusion layer 450c may include Cr, Ti, Ni, Mo, TiW, or W, or combinations thereof and protects the metal reflective layer 450b by preventing diffusion of metal elements. The seed layer 450d is formed for the purpose of deposition and coating of lower electrodes (not shown), which will be formed in a subsequent process. The pad metal layers 450 may be formed by deposition or electroplating. The pad metal layers 450 may have an even thickness or may have different thicknesses depending on regions thereof.

Figure 9B:
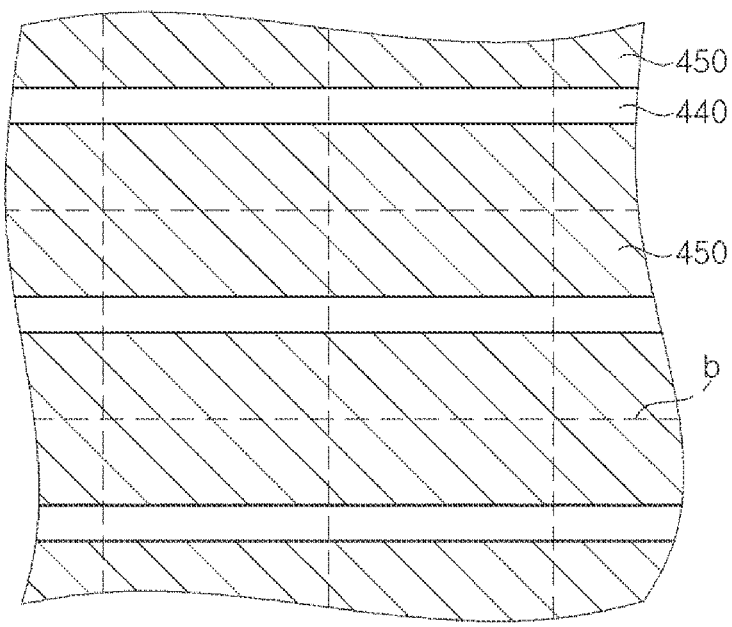

FIG. 9b is a plan view of a part of a wafer before the light emitting diode according to the exemplary embodiment is divided into an individual diode.

Referring to FIG. 9b, the pad metal layers 450 and the first insulation layer 440 are formed in a stripe pattern. For example, the first insulation layer 450 may be exposed between the pad metal layers 450 disposed parallel to each other. Here, a dotted line "a" indicates an isolation line for division of a wafer into individual diodes. The isolation line may be formed in the isolation region illustrated in FIG. 7.

Although the pad metal layers 450 may be divided into first and second conductive type pad metal layers along the dotted line "a", the divided layers are electrically connected to each other inside the wafer such that current can flow therebetween upon electroplating.

Figure 10A:
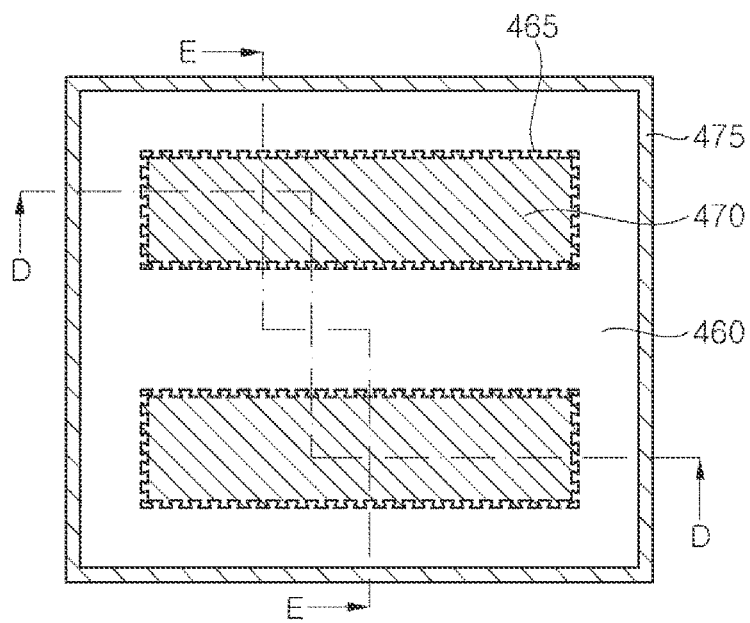
Figure 10B:
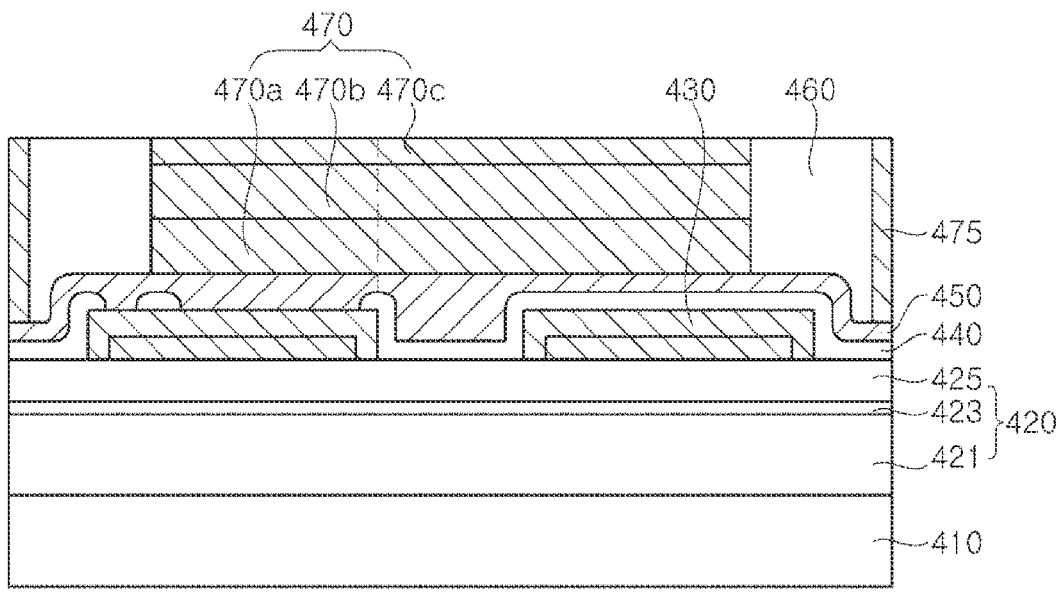
Figure 10B:
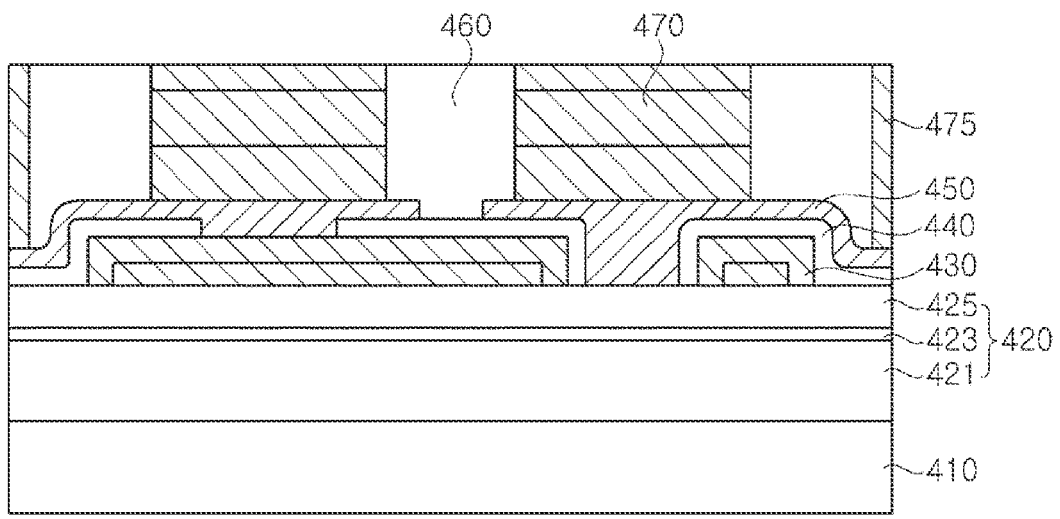

FIG. 10a is a plan view of the light emitting diode according to the exemplary embodiment, in which a mold is formed on the pad metal layer, FIG. 10b top figure is a sectional view taken along line D-D of FIG. 10a, and FIG. 10b bottom figure is a sectional view taken along line E-E of FIG. 10a.

Referring to FIG. 10a and FIG. 10b, a mold 460 and a plurality of lower electrodes 470 are placed on the metal layers 450. The mold 460 includes the lower electrodes 470 in an inner region of the mold 460 and is coupled to the lower electrodes 470 through a plurality of fastening elements 465. Further, the light emitting diode may further include a support 475 that surrounds the mold 460.

The fastening elements 465 may have any of various shapes, and as shown in the drawings, a portion of each of the lower electrodes 470 may be placed between the fastening elements 465. A portion of an outer region of the lower electrode 470 engages with the fastening elements 465 as in engagement between gearwheels.

One fastening element 465 and a portion of the lower electrode 470 placed between the fastening elements 465 may be disposed to exhibit point symmetry with respect to a point. For example, one fastening element 465 and the portion of the lower electrode 470 placed between the fastening elements 465 can overlap each other when rotated 180 degrees about a point. With these structures, the mold 460 and the lower electrodes 470 can be strongly mechanically fastened to each other.

Furthermore, in order to enhance fastening strength between the mold 460 and the lower electrodes 470, each of the fastening elements 465 may have an increasing width towards the lower electrode 470. The fastening elements 465 may have an increasing width towards the lower electrode 470 in the overall region of the fastening elements 465 or in some regions of the fastening elements 465. Further, the fastening elements 465 may include a region in which the width of the fastening elements is continuously or intermittently increased. With this structure, the mold 460 and the lower electrodes 470 can be engaged with each other like gearwheels, thereby providing strong mechanical fastening.

The fastening elements 465 may have any shape so long as the mold 460 and the lower electrodes 470 can be mechanically fastened to each other.

In addition, the mold 460 is surrounded by a support 475. The support 475 enhances structural stability of the light emitting diode during the process while preventing the epitaxial layers 420 from suffering bending or breakage after removal of the growth substrate 410.

The mold 460 may include at least one of photosensitive polyimide, Su-8, photoresist for plating, Parylene, an epoxy molding compound (EMC), or ceramic powder. The mold 460 and/or the lower electrodes 470 may have a height of 20 μm to 200 μm. In addition, an upper surface of the mold 460 may flush with an upper surface of the lower electrodes 470.

In this exemplary embodiment, the thicknesses of the mold 460 and the lower electrodes 470 may be determined as needed. Thus, the mold 260 and the lower electrodes 470 may be generally formed to have a similar thickness to that of a typical metal plate, whereby the light emitting diode according to the exemplary embodiment can be used in the application range available in the related art.

In order to form the mold 460 including the lower electrodes 470 therein, the mold 460 is first formed to cover a part of the pad metal layers 450 and the first insulation layers 450 through deposition and curing. Then, an inner region of the mold 460 is partially removed to form inner open regions through which the pad metal layers 450 are partially exposed. In formation of the inner open region, the mold 460 may be subjected to patterning through exposure and development such that the fastening elements 465 can be formed in the inner region of the mold 460 by the patterning process.

Next, the lower electrodes 470 are formed to fill the inner open regions. The lower electrodes 470 may be formed by deposition, plating or the like. The lower electrodes 470 are formed to contact the pad metal layers 450 while filling the inner open regions, whereby the lower electrodes 470 can be electrically connected to the epitaxial layers 420.

In this exemplary embodiment, with the process and structure as described above, the light emitting diode can prevent deterioration in coupling strength between the mold 460 and the lower electrodes 470 due to a difference in coefficient of thermal expansion therebetween, thereby providing improved reliability of the light emitting diode.

Each of the lower electrodes 470 may include a conduction layer 470a, a barrier layer 470b, and an anti-oxidation layer 470c. The conduction layer 170a serves to promote current spreading and may include Cu or Ag. The barrier layer 470b prevents diffusion of metal elements of the lower electrode 470 and may include Ni or Pd. The anti-oxidation layer 470c prevents oxidation of the lower electrode 470 and may include Au and the like, and an oxidation sacrificial layer including Ag and/or Al may be formed instead of the anti-oxidation layer 470c. The anti-oxidation layer 470c or the oxidation sacrificial layer may be placed on an exposed upper surface of the lower electrode 470.

Figure 10C:
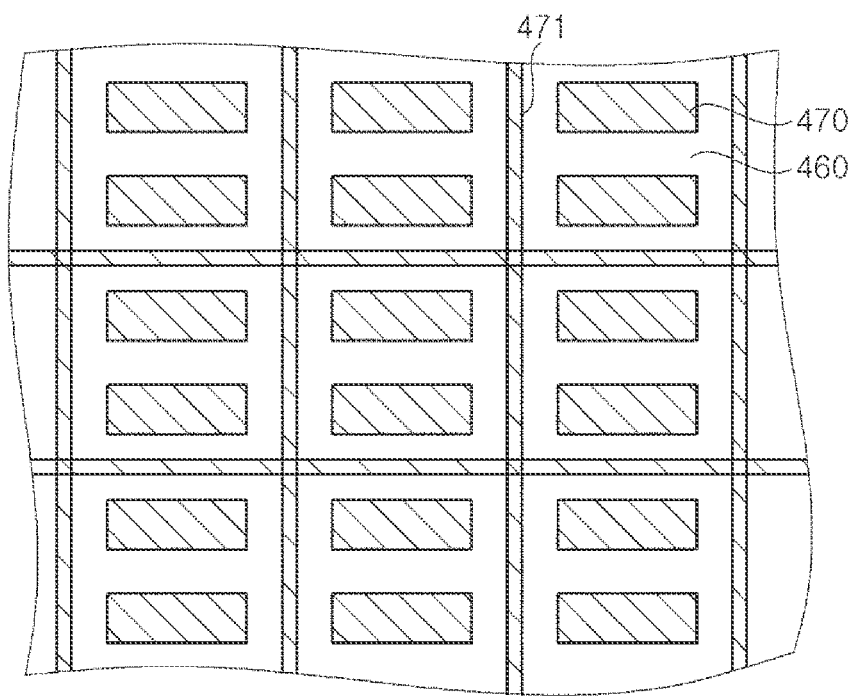

FIG. 10c is a plan view of a part of a wafer before the light emitting diode according to the exemplary embodiment is divided into an individual diode.

Referring to FIG. 10c, the support 475 may be disposed corresponding to an isolation line "b" shown in FIG. 9b. The lower electrodes 470 may be formed by taking into account the locations and areas of the pad metal layers 450 under the lower electrodes 470. The lower electrodes 470 and the support 471 may be formed by the same process. Specifically, the mold 460 is formed on the pad metal layers 450, and some region of the mold 460 is subjected to patterning to expose some of the pad metal layers 450 and the first insulation layer 440. The patterned region of the mold 460 may be an isolation region including the isolation line. With this process, the open region may be filled with the lower electrodes 470 through deposition or coating and curing of a material for the lower electrodes 470, thereby forming the lower electrodes 470 and the support 475. Accordingly, the lower electrodes 470 and the support 471 may be formed of the same material by the same process.

In the light emitting diode according to the exemplary embodiment, the mold 460 and the lower electrodes 470 fastened to each other through the plurality of fastening elements 465 act as a support substrate, thereby minimizing the bowing phenomenon of the epitaxial layers 420, which can occur during separation of the growth substrate 410. In the light emitting diode with this structure, stress applied to the epitaxial layers 420 is minimized, thereby preventing damage to the epitaxial layers 420 after separation of the growth substrate 410. Accordingly, the light emitting diode according to the exemplary embodiment includes the epitaxial layers 420 having good crystal quality with minimized defects, thereby providing high reliability and efficiency.

FIG. 11a to FIG. 11e are views of the first conductive type semiconductor layer 421 after the removal of the growth substrate 410, in which the first conductive type semiconductor layer 421 is disposed to face upward. Thus, in this exemplary embodiment, the mold 460 and the lower electrodes 470 are placed under a light emitting structure 427.

Figure 11B:
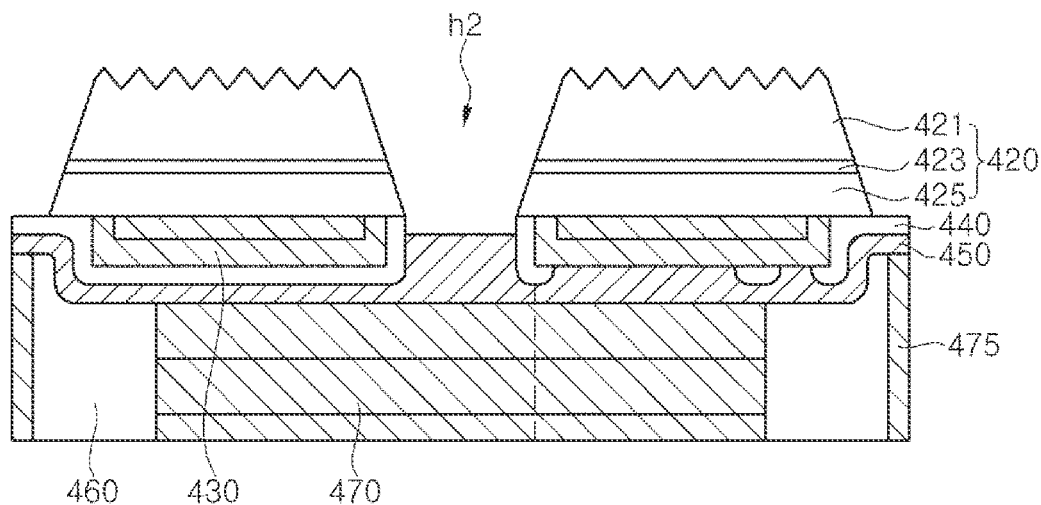
Figure 11B:
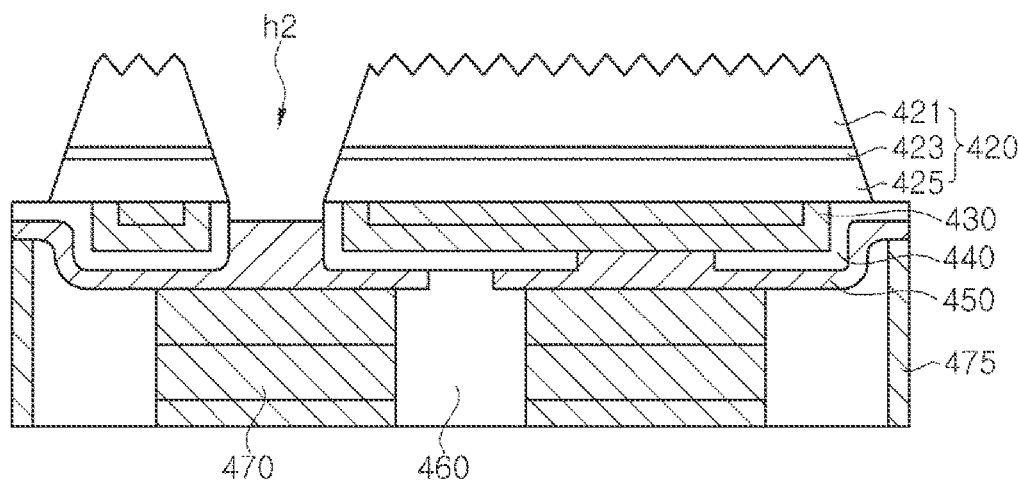

FIG. 11a is a plan view of the first conductive type semiconductor layer of the light emitting diode according to the exemplary embodiment, from which the growth substrate is separated, FIG. 11b top figure is a sectional view taken along line D-D of FIG. 11a, and FIG. 11b bottom figure is a sectional view taken along line E-E of FIG. 11a.

Referring to FIG. 11a and FIG. 11b, the growth substrate 410 is separated from the epitaxial layers 420. The growth substrate 410 may be separated from the epitaxial layers 420 by any of various methods including laser lift-off, chemical lift-off, stress lift-off, thermal lift-off, and the like.

An exposed surface of the lower electrodes 470 may be flattened through chemical mechanical polishing. In addition, roughness may be formed on an exposed surface of the first conductive type semiconductor layer 421 formed by separation of the growth substrate 410. In addition, before formation of the roughness, remaining materials on the surface of the first conductive type semiconductor layer 421 may be chemically or mechanically removed, and the first conductive type semiconductor layer 421 may be removed to a certain thickness from the surface thereof. During separation of the growth substrate 410, defects or damage can occur around the surface of the first conductive type semiconductor layer 421. Accordingly, the surface of the first conductive type semiconductor layer 421 is removed to a certain thickness, whereby overall crystallinity of the first conductive type semiconductor layer 421 can be improved.

The roughness may be formed by wet etching using a KOH and/or NaOH solution, or a sulfuric/phosphoric acid solution, and the like. Alternatively, the roughness may be formed by photo-enhanced chemical (PEC) etching, other wet etching methods, dry etching, or electrolysis. The roughness formed on the surface of the first conductive type semiconductor layer 421 can enhance light extraction efficiency of the light emitting diode.

Thereafter, the light emitting structure 427 may be formed by patterning the epitaxial layers 420. In addition, an isolation region 300 of the wafer may be formed by patterning the epitaxial layers 420. The isolation region refers to a region in which a dicing process will be performed in order to divide the wafer into unit light emitting diodes, and may have the supports 475 at both ends thereof, as shown in FIG. 11b.

Patterning may be performed by dry etching and the like. Together with the patterning process, a via-hole h2 may be formed such that the pad metal layers 450 are partially exposed therethrough. The via-hole h2 may be placed in a region corresponding to the first region 440a. In this exemplary embodiment, a region of the first insulation layer 440 in which the via-hole h1 will be formed is removed, whereby the via-hole h1 exposing a portion of the metal layer 450 can be formed. In this exemplary embodiment, the via-hole h2 is formed by removing a region of the first insulation layer 440 in which the via-hole h2 will be formed. Alternatively, the via-hole h2 may be formed by removing only the epitaxial layers 420, followed by removing the first insulation layer 440.

The via-hole h2 may have a polyprism shape including a reverse truncated pyramidal shape, a reverse truncated conical shape, a cylindrical shape, or a square pillar shape. In this exemplary embodiment, the via-hole h2 has a reverse truncated conical shape, without being limited thereto.

Figure 11C:
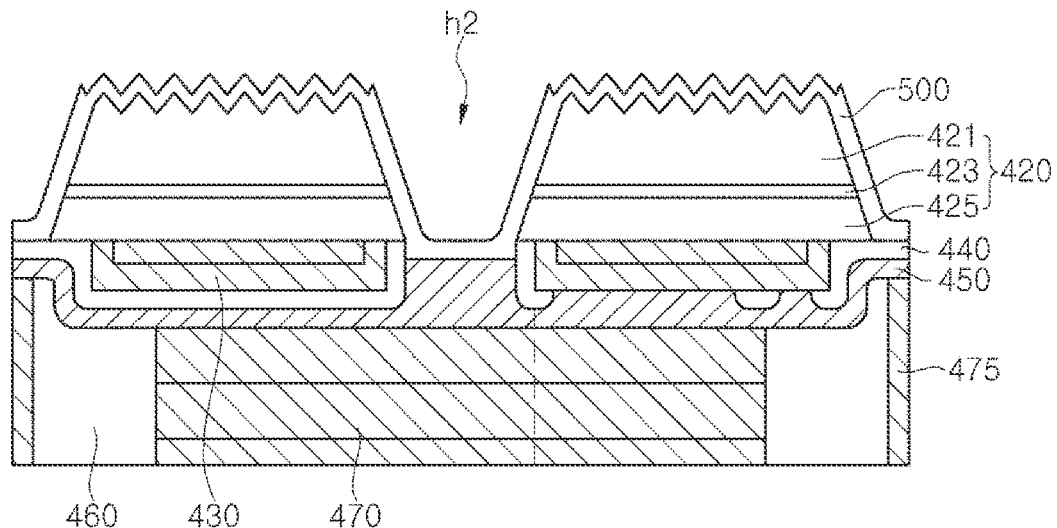
Figure 11C:
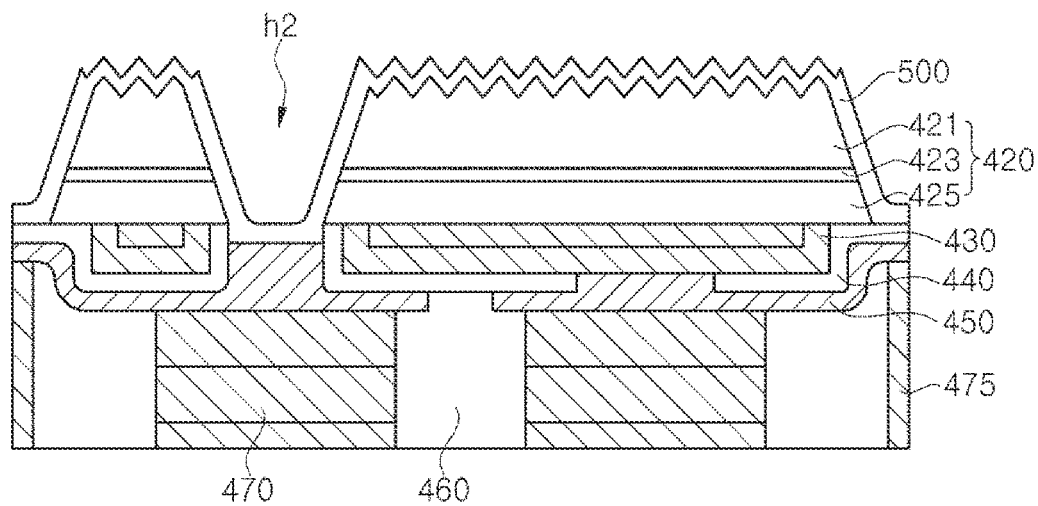

Next, referring to FIG. 11c, a second insulation layer 500 may be formed on the light emitting structure 427 and the supports 475 exposed at both ends of the light emitting diode. FIG. 11c top figure is a sectional view of the light emitting diode in which the second insulation layer 190 is formed in the embodiment of FIG. 11b top figure and FIG. 11c bottom figure is a sectional view of the light emitting diode in which the second insulation layer 500 is formed in the embodiment of FIG. 11b bottom figure.

The second insulation layer 190 may be formed of or include any transparent insulation material through deposition and the like. The second insulation layer 500 prevents the light emitting structure 420 from contacting air.

Figure 11D:
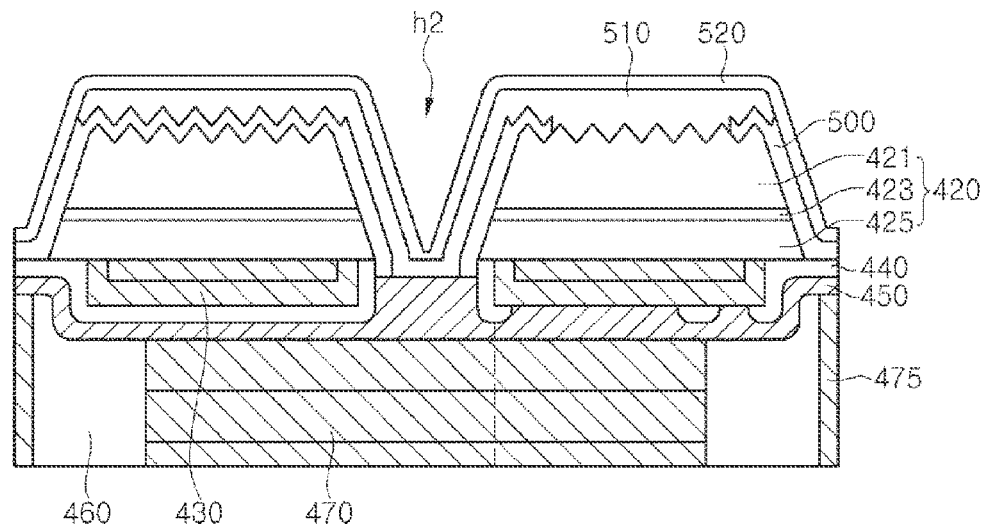
Figure 11D:
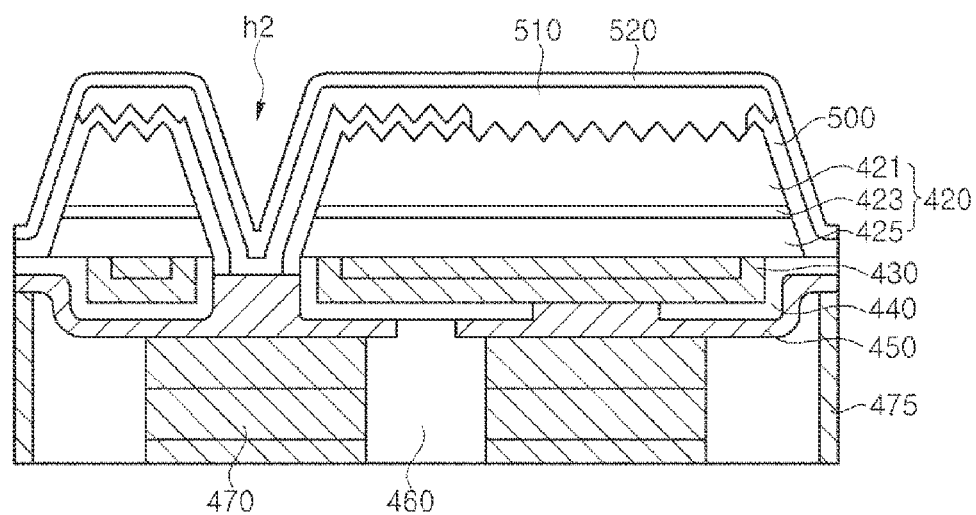
Figure 11E:
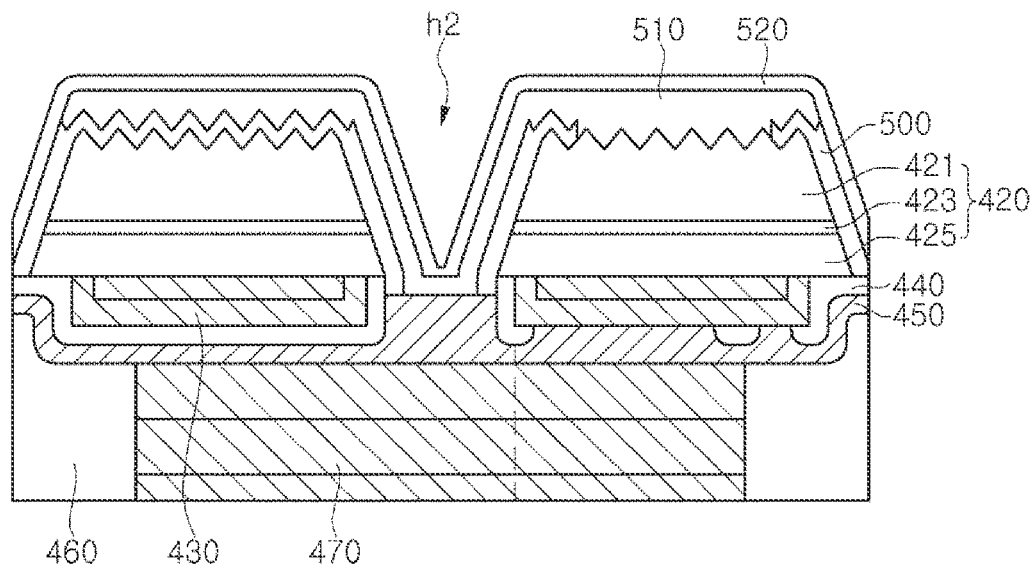
Figure 11E:
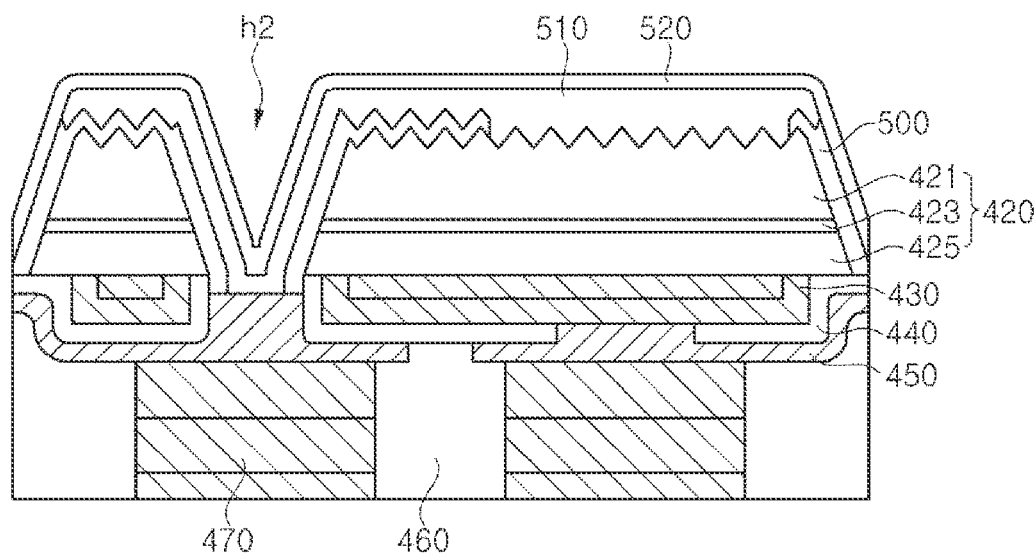

Then, referring to FIG. 11d, an electrode pattern 510 may be formed on a side surface and an upper surface of the light emitting structure 420 while being electrically connected to the first conductive type semiconductor layer 421.

FIG. 11d top figure is a sectional view of the light emitting diode in which the electrode pattern 510 is formed in the embodiment of FIG. 11b top figure and FIG. 11d bottom figure is a sectional view of the light emitting diode in which the electrode pattern 510 is formed in the embodiment of FIG. 11b bottom figure.

In order to form the electrode pattern 510, first, the second insulation layer 500 is partially removed to expose a first nitride semiconductor layer 421. A region in which a portion of the second insulation layer 500 is removed may correspond to the first region 440a (see FIG. 8) below the second insulation layer 500. The region in which the portion of the second insulation layer 500 is removed may be a region in which the via-hole h2 is formed. The electrode pattern 510 may form ohmic contact with the exposed first nitride semiconductor layer 421. The electrode pattern 510 may include a transparent electrode layer. The transparent electrode layer may be formed of or include a transparent conductive oxide (TCO), and may include ITO, ZnO, $SnO_2$ graphene, or carbon nanotubes. The electrode pattern 510 may be formed by a deposition process including sputtering. A portion of the second insulation layer 500 is placed between the electrode pattern 510 and a side surface of the light emitting structure 427 to prevent short circuit of the light emitting structure 427.

In the exemplary embodiments, when a transparent electrode layer is used as an electrode, it is possible to prevent light blocking due to an upper electrode. As a result, the light emitting diode has improved light extraction efficiency.

Then, a third insulation layer 520 is formed to cover an overall upper surface of the light emitting structure 20 including the electrode pattern 510. The third insulation layer 520 may be formed of or include any transparent insulation material through deposition and the like.

Thereafter, a process of dividing the wafer into individual diodes is performed by taking into account the isolation region formed by patterning. This process may include a dicing process using a dicing blade such as a diamond blade. By the dicing process, the supports 475 disposed in the isolation region may be removed.

Through this process, the unit diode region on the wafer as shown in FIG. 11d top figure and bottom figure may be divided into an individual light emitting diode as shown in FIG. 11e top figure and bottom figure.

Figure 12:
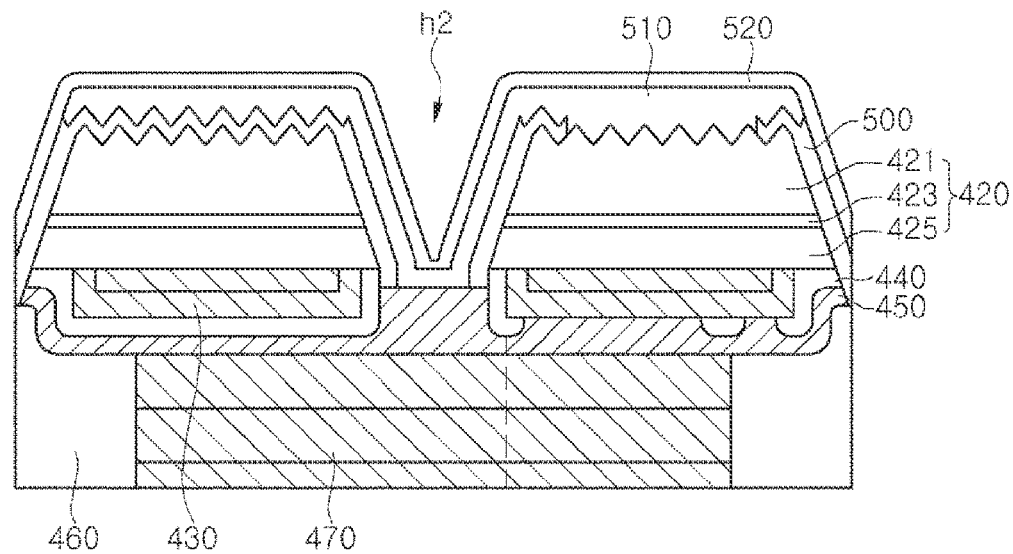
FIG. 12 illustrates sectional views of a light emitting diode according to another exemplary embodiment of the disclosed technology.
Figure 12:
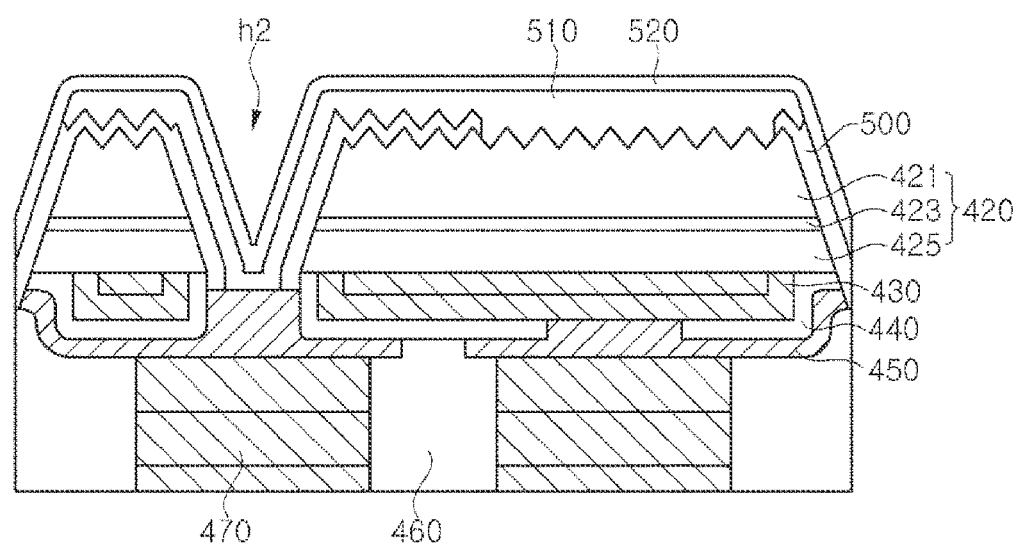

FIG. 12 shows sectional views of a light emitting diode according to another exemplary embodiment.

The light emitting diode shown in top and bottom figures of FIG. 12 has the same structure as the light emitting diode shown in FIG. 11c and differs in that opposite ends of the pad metal layers 450 are exposed by a second insulation layer 500. The explanations on the same configurations will be omitted.

Referring to FIG. 12, the light emitting diode may include the second insulation layer 500 covering the pad metal layers 450 such that opposite ends of the pad metal layers 450 are not exposed to the outside.

This structure may be obtained by patterning the epitaxial layers 420 to form the isolation region of the light emitting structure 427 or the wafer such that the opposite ends of the pad metal layers 450 are placed on the mold 460 without touching the supports 475.

With this structure, the light emitting diode can prevent the pad metal layers 450 from contacting air, thereby improving reliability of the light emitting diode.

In one exemplary embodiment, although not shown in the drawings, before or after the wafer is divided into individual diodes, and may have a uniform thickness, a wavelength conversion layer may be deposited or coated onto a wafer or an individual light emitting diode having the third insulation layer 520 thereon. The wavelength conversion layer may contain or include a resin and phosphors for conversion of light generated in the active layer 423. The phosphors may be mixed with the resin and randomly or evenly disposed in the wavelength conversion layer.

The resin may include a polymer resin such as an epoxy resin or an acryl resin, or a silicone resin, and may act as a matrix in which the phosphors are dispersed. The phosphors may include various phosphors well-known to those skilled in the art, and may include at least one phosphor including garnet phosphors, aluminate phosphors, sulfide phosphors, oxynitride phosphors, nitride phosphors, fluoride phosphors, or silicate phosphors, without being limited thereto.

The wavelength conversion layer may be deposited or coated by any of various methods including aerosol spraying, pulsed laser deposition (PLD), printing, or spin-on-glass (SOG) coating, and the like.

Further, in one exemplary embodiment, although not shown in the drawings, before or after the wafer is divided into individual diodes, an optical glass lens may be deposited or coated onto a wafer or an individual light emitting diode having the third insulation layers 520 thereon. The optical glass lens can adjust a beam angle of light generated in the active layer 423. Further, a secondary optical lens may be formed on the light emitting diode using an optical glass lens in the form of a micro lens or a Fresnel lens. The optical glass lens may be bonded to the light emitting diode using SOG or a transparent organic material as a bonding agent. Use of the optically transparent SOG or the transparent organic material can reduce light loss. Furthermore, the optical glass lens may be formed after formation of the wavelength conversion layer on the light emitting diode.

In the exemplary embodiment, the light emitting diode may be directly mounted on a printed circuit board through the lower electrodes 170 surrounded by the mold 160, and prevents the side surfaces of the lower electrodes 470 from being exposed to the outside, thereby preventing metal elements such as tin (Sn) in the solder paste from diffusing into the light emitting diode. Further, in the light emitting diode according to the exemplary embodiments, the mold 460 and the lower electrodes 470 are mechanically fastened to each other by the fastening elements 465, thereby improving reliability of the light emitting diode.

In addition, as the electrode pattern 510, the transparent electrode layer is placed on the upper surface of the light emitting structure, thereby improving light extraction efficiency of the light emitting diode by suppressing light blocking.

Although some exemplary embodiments have been illustrated in conjunction with the drawings, it will be apparent to those skilled in the art that various modifications, changes and substitutions can be made. Therefore, it should be understood that these embodiments and the accompanying drawings are provided as examples only.

What is claimed is:

1. A light emitting diode comprising:
   a lower electrode providing a passage for an electric current;
   a light emitting structure placed over the lower electrode to be electrically connected to the lower electrode and operable to emit light in response to the electric current, the light emitting structure is disposed to form a via-hole;
   a reflective electrode layer placed between the lower electrode and the light emitting structure to conduct the electric current from the lower electrode to the light emitting structure; and
   an electrode pattern formed around the light emitting structure and electrically connecting the lower electrode to the light emitting structure through the via-hole.

2. The light emitting diode according to claim 1, wherein the electrode pattern comprises a transparent electrode layer comprising ITO, ZnO, SnO2, graphene, or carbon nanotubes.

3. The light emitting diode according to claim 1, further comprising:
   a mold surrounding a side of the lower electrode,
   wherein a lower surface of the lower electrode is flush with a lower surface of the mold.

4. The light emitting diode according to claim 3, wherein the mold comprises a plurality of fastening elements, the mold being mechanically fastened to the lower electrode through the plurality of fastening elements.

5. The light emitting diode according to claim 4, wherein each of the fastening elements comprises a plurality of depressions and a plurality of protrusions, the plurality of protrusions having an increasing width in a protruding direction.

6. The light emitting diode according to claim 5, wherein the plurality of protrusions have a continuously or intermittently varying width.

7. The light emitting diode according to claim 3, wherein the mold comprises a photosensitive polyimide, Su-8, photoresist for plating, Parylene, an epoxy molding compound (EMC), or ceramic powder.

8. The light emitting diode according to claim 1, wherein the lower electrode has a height of 20 μm to 200 μm.

9. The light emitting diode according to claim 1, wherein the reflective electrode layer comprises a reflective metal layer and a capping metal layer covering the reflective metal layer.

10. The light emitting diode according to claim 1, further comprising:
    a pad metal layer placed between the lower electrode and the reflective electrode layer to be electrically connected to the lower electrode,
    the pad metal layer being electrically connected to the electrode pattern through the via-hole.

11. The light emitting diode according to claim 10, further comprising:
    a first insulation layer placed between the reflective electrode layer and the pad metal layer,
    the first insulation layer is disposed to expose a first region corresponding to the via-hole and a second region in which the reflective electrode layer is electrically connected to the pad metal layer.

12. The light emitting diode according to claim 11, wherein the first insulation layer comprises a distributed Bragg reflector.

13. The light emitting diode according to claim 11, wherein the light emitting diode comprises a second lower electrode separated from the lower electrode, and one of the lower electrodes is electrically connected to the electrode reflective layer through the second region and the other of the lower electrode is electrically connected to the electrode pattern through the first region.

14. The light emitting diode according to claim 11, wherein the electrode pattern is formed to include a portion to be electrically connected to the light emitting structure.

15. The light emitting diode according to claim 1, further comprising:
    a second insulation layer insulating a side surface of the light emitting structure and a portion of an upper surface of the light emitting structure from the electrode pattern.

16. The light emitting diode according to claim 1, wherein a surface of the light emitting structure includes roughness.

17. The light emitting diode according to claim 1, wherein the lower electrode comprises a conduction layer, a barrier layer, or an anti-oxidation layer.

18. The light emitting diode according to claim 1, wherein the electrode pattern comprises a plurality of extensions extending in one direction of the light emitting diode.

19. The light emitting diode according to claim 18, wherein the reflective electrode layer is patterned to include an isolation region in which a reflective electrode material for the reflective electrode layer is not present, and wherein at least some of the plurality of extensions overlaps the isolation region.

20. The light emitting diode according to claim 1, wherein the electrode pattern comprises a first extension and a second extension,
    the first extension extending away from the via-hole,
    the second extension extending perpendicularly to the first extension.

* * * * *